(12) United States Patent
Luten et al.

(10) Patent No.: US 8,035,881 B2
(45) Date of Patent: Oct. 11, 2011

(54) MULTI-ZONE MIRRORS

(75) Inventors: Henry A. Luten, Holland, MI (US);
John S. Anderson, Holland, MI (US);
George A. Neuman, Holland, MI (US);
Jeffrey A. Forgette, Hudsonville, MI (US); Jeffrey N. Williams, Kentwood, MI (US); Lansen M. Perron, Jenison, MI (US)

(73) Assignee: Gentex Corporation, Zeeland, MI (US)

( * ) Notice: Subject to any disclaimer, the term of this patent is extended or adjusted under 35 U.S.C. 154(b) by 165 days.

(21) Appl. No.: 12/370,909

(22) Filed: Feb. 13, 2009

(65) Prior Publication Data
US 2009/0207513 A1    Aug. 20, 2009

Related U.S. Application Data

(63) Continuation-in-part of application No. 12/138,206, filed on Jun. 12, 2008, which is a continuation-in-part of application No. 11/833,701, filed on Aug. 3, 2007, now Pat. No. 7,746,534, which is a continuation-in-part of application No. 11/713,849, filed on Mar. 5, 2007, now Pat. No. 7,688,495.

(60) Provisional application No. 61/028,415, filed on Feb. 13, 2008.

(51) Int. Cl.
*G02F 1/15* (2006.01)
(52) U.S. Cl. .................................... 359/265; 359/267
(58) Field of Classification Search .............. 359/267, 359/265, 275, 271, 272, 273, 601
See application file for complete search history.

(56) References Cited

U.S. PATENT DOCUMENTS

| | | | |
|---|---|---|---|
| 1,096,452 A | 5/1914 | Perrin |
| 1,563,258 A | 11/1925 | Cunningham |
| 2,457,348 A | 12/1948 | Chambers |
| 2,561,582 A | 7/1951 | Marbel |
| 3,280,701 A | 10/1966 | Donnelly et al. |
| 3,712,710 A | 1/1973 | Castellion et al. |
| 3,847,701 A | 11/1974 | Fairbanks |
| 4,274,078 A | 6/1981 | Isobe et al. |

(Continued)

FOREIGN PATENT DOCUMENTS

AT            402945 B      9/1997
(Continued)

OTHER PUBLICATIONS

Roberts, John K. "Dichroic Mirrors with Semi-active Covert Displays," Interior & Exterior Systems, International Body Engineering Conf. Sep. 21-23, 1993, pp. 65-69.

(Continued)

*Primary Examiner* — Joseph P Martinez
(74) *Attorney, Agent, or Firm* — Yakov Sidorin; Quarles & Brady LLP

(57) ABSTRACT

A multi-zone reflector having an opaque zone and a transflective zone. The reflector includes a supporting base, a lower reflecting layer disposed adjacent the supporting base, and an upper reflecting layer extending over the opacifying layer and the transflective zone of the reflector. The lower reflecting layer substantially completely covers the transflective zone, and the opacifying layer is disposed substantially outside the transflective zone adjacent to the lower reflecting layer. Over at least a portion of the transflective zone, the upper and lower reflecting layers have a common surface.

31 Claims, 18 Drawing Sheets

U.S. PATENT DOCUMENTS

| | | |
|---|---|---|
| 4,733,335 A | 3/1988 | Serizawa et al. |
| 4,803,599 A | 2/1989 | Trine et al. |
| 4,827,086 A | 5/1989 | Rockwell |
| 4,855,550 A | 8/1989 | Schultz, Jr. |
| 4,859,813 A | 8/1989 | Rockwell |
| 4,902,108 A | 2/1990 | Byker |
| 5,014,167 A | 5/1991 | Roberts |
| 5,016,996 A | 5/1991 | Ueno |
| 5,017,903 A | 5/1991 | Krippelz, Sr. |
| 5,052,163 A | 10/1991 | Czekala |
| 5,059,015 A | 10/1991 | Tran |
| 5,066,112 A | 11/1991 | Lynam et al. |
| 5,069,535 A | 12/1991 | Baucke et al. |
| 5,073,012 A | 12/1991 | Lynam |
| 5,076,673 A | 12/1991 | Lynam et al. |
| 5,115,346 A | 5/1992 | Lynam |
| 5,151,824 A | 9/1992 | O'Farrell et al. |
| 5,158,638 A | 10/1992 | Osanami et al. |
| 5,177,031 A | 1/1993 | Buchmann et al. |
| 5,207,492 A | 5/1993 | Roberts |
| 5,239,406 A | 8/1993 | Lynam |
| 5,253,109 A | 10/1993 | O'Farrell et al. |
| 5,313,335 A | 5/1994 | Gray et al. |
| 5,355,284 A | 10/1994 | Roberts |
| 5,361,190 A | 11/1994 | Roberts et al. |
| 5,371,659 A | 12/1994 | Pastrick et al. |
| 5,379,146 A | 1/1995 | Defendini |
| 5,402,103 A | 3/1995 | Tashiro |
| 5,408,353 A | 4/1995 | Nichols et al. |
| 5,436,741 A | 7/1995 | Crandall |
| D363,920 S | 11/1995 | Roberts et al. |
| 5,481,409 A | 1/1996 | Roberts |
| 5,497,305 A | 3/1996 | Pastrick et al. |
| 5,497,306 A | 3/1996 | Pastrick |
| 5,523,877 A | 6/1996 | Lynam |
| 5,528,422 A | 6/1996 | Roberts |
| 5,587,699 A | 12/1996 | Faloon et al. |
| 5,610,380 A | 3/1997 | Nicolaisen |
| 5,619,374 A | 4/1997 | Roberts |
| 5,619,375 A | 4/1997 | Roberts |
| 5,632,551 A | 5/1997 | Roney et al. |
| 5,649,756 A | 7/1997 | Adams et al. |
| 5,668,663 A | 9/1997 | Varaprasad et al. |
| 5,669,699 A | 9/1997 | Pastrick et al. |
| 5,669,704 A | 9/1997 | Pastrick |
| 5,669,705 A | 9/1997 | Pastrick et al. |
| 5,718,980 A | 2/1998 | Koch et al. |
| 5,724,187 A | 3/1998 | Varaprasad et al. |
| 5,748,172 A | 5/1998 | Song et al. |
| D394,833 S | 6/1998 | Muth |
| 5,788,357 A | 8/1998 | Muth et al. |
| 5,790,298 A | 8/1998 | Tonar |
| 5,796,176 A | 8/1998 | Kramer et al. |
| 5,798,575 A | 8/1998 | O'Farrell et al. |
| 5,818,625 A | 10/1998 | Forgette et al. |
| 5,823,654 A | 10/1998 | Pastrick et al. |
| 5,825,527 A | 10/1998 | Forgette et al. |
| 5,863,116 A | 1/1999 | Pastrick et al. |
| 5,864,419 A | 1/1999 | Lynam |
| 5,879,074 A | 3/1999 | Pastrick |
| D409,540 S | 5/1999 | Muth |
| 5,923,457 A | 7/1999 | Byker et al. |
| 5,938,320 A | 8/1999 | Crandall |
| 5,959,367 A | 9/1999 | O'Farrell et al. |
| 6,005,724 A | 12/1999 | Todd |
| 6,007,222 A | 12/1999 | Thau |
| 6,045,243 A | 4/2000 | Muth et al. |
| D425,466 S | 5/2000 | Todd et al. |
| 6,062,920 A | 5/2000 | Jordan et al. |
| 6,064,508 A | 5/2000 | Forgette et al. |
| 6,068,380 A | 5/2000 | Lynn et al. |
| D426,506 S | 6/2000 | Todd et al. |
| D426,507 S | 6/2000 | Todd et al. |
| D427,128 S | 6/2000 | Mathieu |
| 6,074,077 A | 6/2000 | Pastrick et al. |
| 6,076,948 A | 6/2000 | Bukosky et al. |
| D428,372 S | 7/2000 | Todd et al. |
| D428,373 S | 7/2000 | Todd et al. |
| 6,086,229 A | 7/2000 | Pastrick |
| 6,093,976 A | 7/2000 | Kramer et al. |
| D428,842 S | 8/2000 | Todd et al. |
| D429,202 S | 8/2000 | Todd et al. |
| D430,088 S | 8/2000 | Todd et al. |
| 6,099,155 A | 8/2000 | Pastrick et al. |
| 6,102,546 A | 8/2000 | Carter |
| 6,111,683 A | 8/2000 | Cammenga et al. |
| 6,111,684 A | 8/2000 | Forgette et al. |
| 6,111,685 A | 8/2000 | Tench et al. |
| 6,124,886 A | 9/2000 | DeLine et al. |
| 6,142,656 A | 11/2000 | Kurth |
| 6,146,003 A | 11/2000 | Thau |
| 6,149,287 A | 11/2000 | Pastrick et al. |
| 6,152,590 A | 11/2000 | Furst et al. |
| 6,163,083 A | 12/2000 | Kramer et al. |
| 6,166,848 A * | 12/2000 | Cammenga et al. .......... 359/267 |
| 6,170,956 B1 | 1/2001 | Rumsey et al. |
| 6,175,164 B1 | 1/2001 | O'Farrell et al. |
| 6,176,602 B1 | 1/2001 | Pastrick et al. |
| 6,195,194 B1 | 2/2001 | Roberts et al. |
| 6,206,553 B1 | 3/2001 | Boddy et al. |
| 6,227,689 B1 | 5/2001 | Miller |
| 6,239,899 B1 | 5/2001 | DeVries et al. |
| 6,244,716 B1 | 6/2001 | Steenwyk et al. |
| 6,249,369 B1 | 6/2001 | Theiste et al. |
| 6,257,746 B1 | 7/2001 | Todd et al. |
| 6,264,353 B1 | 7/2001 | Caraher et al. |
| 6,276,821 B1 | 8/2001 | Pastrick et al. |
| 6,280,069 B1 | 8/2001 | Pastrick et al. |
| 6,296,379 B1 | 10/2001 | Pastrick |
| 6,299,333 B1 | 10/2001 | Pastrick et al. |
| 6,301,039 B1 | 10/2001 | Tench |
| 6,317,248 B1 | 11/2001 | Agrawal et al. |
| 6,336,737 B1 | 1/2002 | Thau |
| 6,340,849 B1 | 1/2002 | Kramer et al. |
| 6,340,850 B2 | 1/2002 | O'Farrell et al. |
| 6,347,880 B1 | 2/2002 | Furst et al. |
| 6,356,376 B1 | 3/2002 | Tonar et al. |
| 6,379,013 B1 | 4/2002 | Bechtel et al. |
| 6,407,468 B1 | 6/2002 | LeVesque et al. |
| 6,407,847 B1 | 6/2002 | Poll et al. |
| 6,420,800 B1 | 7/2002 | LeVesque et al. |
| 6,426,568 B2 | 7/2002 | Turnbull et al. |
| 6,441,943 B1 | 8/2002 | Roberts et al. |
| 6,441,963 B2 | 8/2002 | Murakami et al. |
| 6,471,362 B1 | 10/2002 | Carter et al. |
| 6,512,203 B2 | 1/2003 | Jones et al. |
| 6,606,183 B2 | 8/2003 | Ikai et al. |
| 6,614,579 B2 | 9/2003 | Roberts et al. |
| 6,621,616 B1 | 9/2003 | Bauer et al. |
| 6,639,360 B2 | 10/2003 | Roberts et al. |
| 6,650,457 B2 | 11/2003 | Busscher et al. |
| 6,679,608 B2 | 1/2004 | Bechtel et al. |
| 6,700,692 B2 | 3/2004 | Tonar et al. |
| 6,737,629 B2 | 5/2004 | Nixon et al. |
| 6,749,308 B1 | 6/2004 | Niendorf et al. |
| 6,755,542 B2 | 6/2004 | Bechtel et al. |
| 6,805,474 B2 | 10/2004 | Walser et al. |
| 6,831,268 B2 | 12/2004 | Bechtel et al. |
| 6,849,165 B2 | 2/2005 | Kloppel et al. |
| 6,870,656 B2 | 3/2005 | Tonar et al. |
| 6,928,366 B2 | 8/2005 | Ockerse et al. |
| 7,004,592 B2 * | 2/2006 | Varaprasad et al. .......... 359/603 |
| 7,154,657 B2 | 12/2006 | Poll et al. |
| 7,255,451 B2 | 8/2007 | McCabe et al. |
| 7,274,501 B2 | 9/2007 | McCabe et al. |
| 7,287,868 B2 | 10/2007 | Carter et al. |
| 7,745,992 B2 * | 6/2010 | Ko ................................. 313/506 |
| 2002/0126497 A1 | 9/2002 | Pastrick |
| 2002/0154379 A1 | 10/2002 | Tonar et al. |
| 2002/0171906 A1 | 11/2002 | Busscher et al. |
| 2003/0228416 A1 | 12/2003 | Iwamaru |
| 2004/0028955 A1 | 2/2004 | Hoffman |
| 2004/0061920 A1 | 4/2004 | Tonar et al. |
| 2004/0095632 A1 | 5/2004 | Busscher et al. |
| 2005/0099693 A1 | 5/2005 | Schofield et al. |
| 2005/0195488 A1 | 9/2005 | McCabe et al. |
| 2005/0264891 A1 | 12/2005 | Uken et al. |

| | | | |
|---|---|---|---|
| 2007/0002422 | A1 | 1/2007 | O'Shaughnessy |
| 2008/0030836 | A1 | 2/2008 | Tonar et al. |
| 2008/0302657 | A1 | 12/2008 | Luten et al. |
| 2008/0310005 | A1 | 12/2008 | Tonar et al. |

FOREIGN PATENT DOCUMENTS

| | | |
|---|---|---|
| CA | 2028461 | 11/1994 |
| DE | 6940469 T2 | 3/1998 |
| EP | 0240226 | 10/1987 |
| EP | 0450162 | 12/1990 |
| EP | 0531143 | 3/1993 |
| GB | 2161440 | 1/1986 |
| WO | 8902135 | 3/1989 |
| WO | 9530495 | 11/1995 |
| WO | 9940039 | 8/1999 |
| WO | 0030893 | 6/2000 |
| WO | 03103338 | 12/2003 |
| WO | PCT/US2007/005494 | 3/2007 |
| WO | PCT/US2007/005520 | 3/2007 |
| WO | PCT/US2007/005638 | 3/2007 |

OTHER PUBLICATIONS

International Searching Authority International Preliminary Report on Patentability, dated Sep. 9, 2008, in international application No. PCT/US07/05494.

International Searching Authority International Search Report, dated Feb. 6, 2008, in international application No. PCT/US07/05638.

International Searching Authority International Search Report, dated Apr. 2, 2008, in international application No. PCT/US/05520.

U.S. Appl. No. 11/833,701, filed Aug. 3, 2007, Improved Thin-Film Coatings, Electro-Optic Elements and Assemblies Incorporating These Elements, Tonar et al.

U.S. Appl. No. 11/682,098, filed Mar. 5, 2007, Electro-Optic Element Including Metallic Films and Methods for Applying the Same, Dozeman et al.

U.S. Appl. No. 11/682,121, filed Mar. 5, 2007, Electro-Optic Element Including IMI Coatings, George A. Neuman et al.

U.S. Appl. No. 10/863,638, filed Jun. 8, 2004, Rearview Mirror Element Having a Circuit Mounted to the Rear Surface of the Element, Frederick Bauer et al.

Supplementary European Search Report and Written Opinion in European patent application No. EP08827166; 8 pages.

Automated translation of reference HA submitted herewith, as provided by EPO.

* cited by examiner

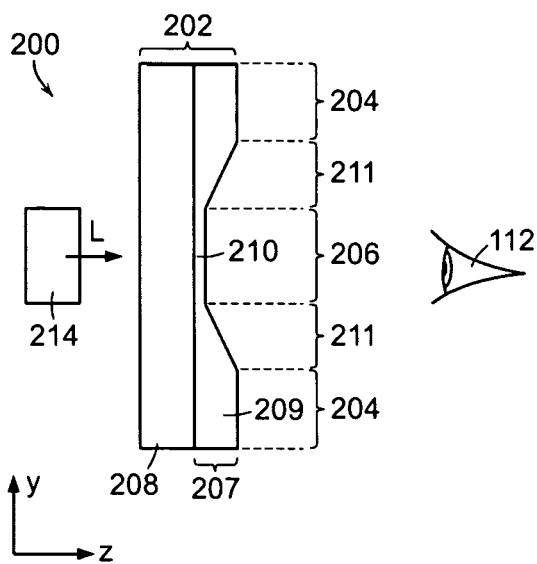
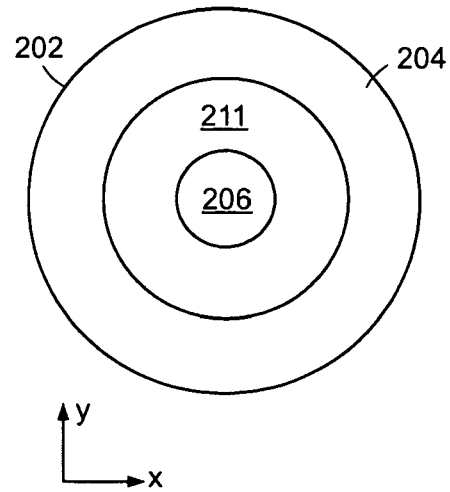
FIG. 2A　　　　　　　　　FIG. 2B
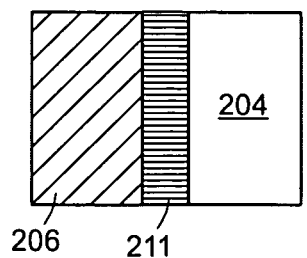
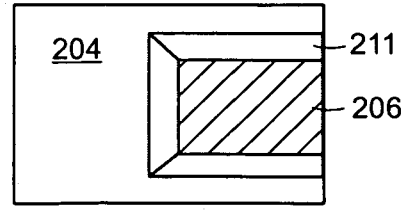
FIG. 2C　　　　　　　　　FIG. 2D

MULTI-ZONE MIRRORS

CROSS-REFERENCE TO RELATED APPLICATIONS

The present application is a continuation-in-part of U.S. patent application Ser. No. 12/138,206, filed on Jun. 12, 2008 and published as U.S. 2008/0302657, which is a continuation-in-part of U.S. patent application Ser. No. 11/833,701, filed on Aug. 3, 2007 and published as U.S. 2008/0310005, which is a continuation-in-part of U.S. patent application Ser. No. 11/713,849, filed on Mar. 5, 2007 and published as U.S. 2008/0030836. The disclosure of each of these applications is incorporated herein by reference in its entirety. The present application claims priority to each of the abovementioned patent application. In addition, the present application also claims priority from U.S. Provisional Patent Application No. 61/028,415, filed on Feb. 13, 2008, the disclosure of which is incorporated herein by reference in its entirety.

TECHNICAL FIELD

The present invention related to thin-film coatings and, more particularly, to thin-film coatings providing a close match of visual appearances between the opaque and transflective areas of multi-zone reflectors (such as mirrors or electro-optical reflecting elements) and assemblies incorporating such reflectors.

SUMMARY OF THE INVENTION

Embodiments of the present invention provide for multi-zone reflectors such as, e.g., image-forming mirrors, prismatic rearview automotive mirrors, or electrochromic vehicular mirrors that include zones having different optical characteristics. In particular, different zones of embodiments of a multi-zone reflector such as opaque and transflective zones may have different transmission. Embodiments of the invention generally include a substantially transparent supporting base (which may be an optical substrate or an optical substrate with an optical film construct such as at least one of optical films deposited thereon), a lower reflecting layer disposed adjacent the supporting base, the lower reflecting layer substantially completely covering a first transflective zone of the reflector, and an opacifying layer having a lower surface facing the supporting base and an upper surface, the opacifying layer disposed substantially outside the first transflective zone adjacent to the lower reflecting layer of the reflector. Embodiments may further include an upper reflecting layer extending substantially completely over the opacifying layer and the first transflective zone of the reflector, the upper reflecting layer and the lower reflecting layer having a common surface over at least a portion of the first transflective zone. In some embodiments, the opacifying layer may have an abrupt edge that defines a transition between the opaque and transflective zones. In different embodiments, the opacifying layer may have graded thickness that identifies a gradual transition bridging the opaque and transflective zones.

Embodiments of a reflector of the invention may have at least one optical characteristic that does not vary spatially across the reflector. For example, the reflectivity may vary inappreciably across the entire surface of the reflector, either in spectral content or in spectrally-integrated reflectance. A specific embodiment, for example, may be characterized by reflectance of about 65 percent that is uniform across the reflector and transmittance below 25 percent in the transflective area and below 0.5 percent in the opaque area. In related embodiments, the opacifying layer may have an opening or an aperture at the transflective zone of the reflector. Specific embodiments of the invention may include several transflective zones that may be disjoined and that are characterized by different values of transmittance.

Related embodiments may further comprise a flash layer of material interposed at the opaque zone between the upper continuous reflecting layer and the upper surface of the opacifying layer. Such flash layer may substantially completely cover the opacifying layer and may have thickness increasing in a direction from the transflective zone to the opaque zone.

In the specific embodiments where the opacifying layer has graded thickness, thickness of the opacifying layer may increase at a first rate with displacement in a first direction from the transflective zone to an opaque zone of the reflector. In addition or alternatively, the upper continuous reflecting layer, which may substantially completely cover the upper surface of the opacifying layer and the transflective zone, may have thickness decreasing, at a second rate, with displacement in a second direction from the transflective zone to the opaque zone of the reflector. The first and second rates of change of thicknesses of the layers may be either equal or different. Generally, the spectral content of light reflected from the opaque zone of an embodiment of the invention and that of light reflected from the transflective zone differ by no more that 5 units of $\Delta E^*$ per centimeter, where $\Delta E^*$ is defined below, but in specific embodiments such difference value may be less than 2.5 units or even 1 unit.

Other alternative embodiments provide a multi-zone reflector including a substantially transparent supporting base; a lower reflective layer substantially continuously covering a transflective zone of the supporting base; and a thin-film stack disposed on the lower reflective layer. The thin-film stack may include a first opacifying layer characterized by a lateral bound, where the first opacifying layer is deposited adjacent the lower reflective layer so as to define a first zone of the stack that is free of the first opacifying layer. The first opacifying layer may have a thickness decreasing in a direction towards the first zone. and the thin-film stack, then, also has a second opacifying layer deposited adjacent the first layer so as to extend over the first opacifying layer and beyond the lateral bound of the first opacifying layer, the second opacifying layer defining a second zone of the stack that is free of the second opacifying layer. The second zone is characterized by a lateral extent that is smaller than a lateral extent of the first zone, and the second zone is partially aligned with the first zone along a direction perpendicular to the stack.

Additionally or alternatively, the thin-film stack of an embodiment of a multi-zone reflector of the invention may include a first opacifying layer with a first opening deposited adjacent the lower reflective layer and a second opacifying layer with a second opening deposited adjacent the first opacifying layer. The second opacifying layer extends over at least part of the first opening, and the first opacifying layer has a graded portion characterized by thickness increasing in a direction away from the first opening.

BRIEF DESCRIPTION OF THE DRAWINGS

In the drawings:

FIG. 2 schematically illustrates embodiments of a viewing mirror assembly including a reflector and a display device disposed behind the reflector. The reflector is characterized by the opaque and display areas and a gradual transition region between them. (A) and (B): side and front views of a circular embodiment; (C): front view of a linearly arranged embodiment; (D): front view of a rectangularly arranged embodiment. L: light generated by a display positioned behind the display area of the mirror element.

DETAILED DESCRIPTION OF SPECIFIC EMBODIMENTS

Figure 1:
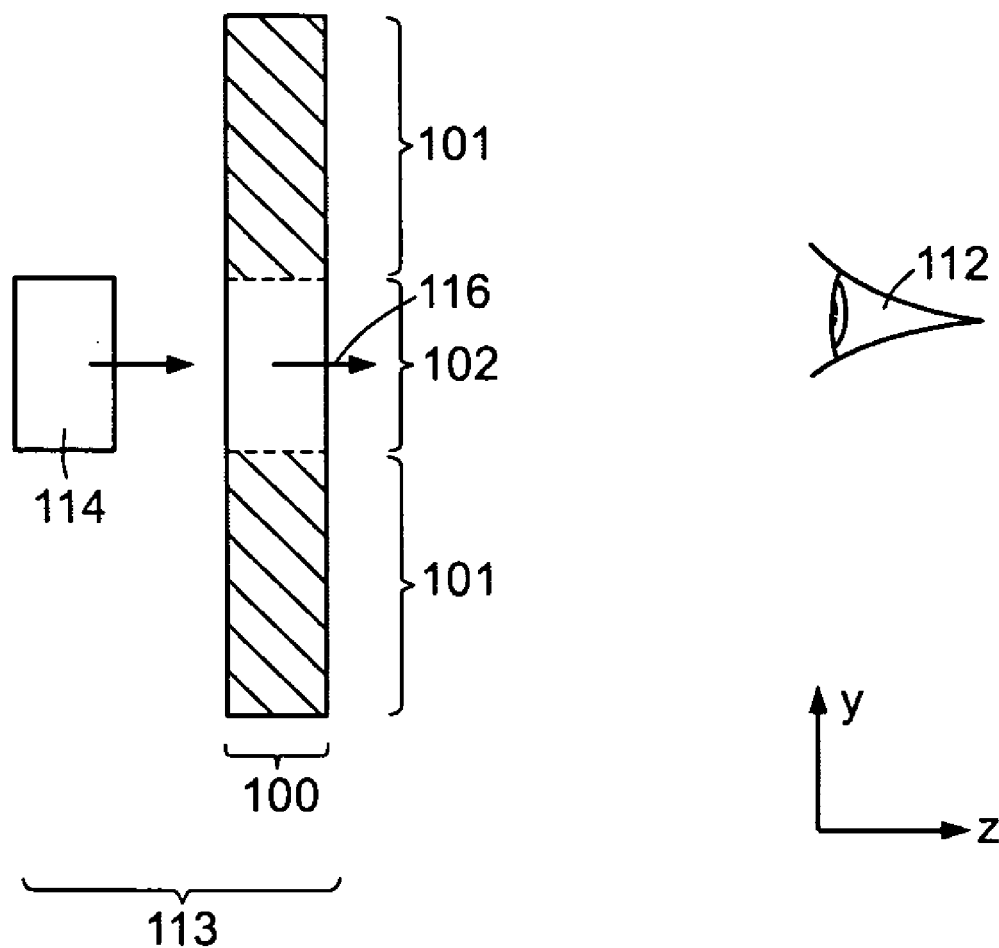
FIG. 1 shows a multi-zone reflector having an opaque area and a transflective display area.

Definitions. As used in this description and the accompanying claims, the following terms shall have the meanings indicated, unless the context otherwise requires:

The term "opaque" is applied in the following relative sense. "Opaque" refers to an optical element or material that is not appreciably transparent or translucent at wavelengths in question and thus does not allow light at such wavelengths to pass through. In the context of a mirror for viewing reflected and displayed images, for example, a portion or area of the mirror that does not transmit any significant amount of light may be characterized as opaque. If a light source such as a display device were positioned behind such portion of the mirror, then the viewer located in front of the mirror would not be able to see a substantial amount of light from the light source. The amount of light blocking or residual level of transmittance required for a region to be characterized as opaque will vary with application, and pertinent ranges are defined below. In various embodiments of the invention, an opaque area may have transmittance below 5 percent, preferably below 2.5 percent, more preferably below 1 percent and most preferably below 0.5 percent. Reflectance of the opaque area of the mirror generally remains significant, and the viewer will be able to see the ambient light reflected by the opaque area.

"Transflective" describes an optical element or component that has a useful non-zero level of transmittance and also has a useful, non-zero level of reflectance in a specified spectral region. In the context of an image-forming reflector, such as a mirror for viewing reflected images, for example, the viewer in front of the mirror may not only observe an image of the ambient objects, formed in reflection from such transflective area but also receive information contained in the displayed image delivered with light from the light source located behind the transflective area of the mirror.

Terms "multi-zone" mirror element and "multi-region" mirror element or reflector refer to an image-forming reflector or mirror having at least two optically different zones, i.e. at least two continuous stretches or regions within which specific distinctive optical characteristics exist or are established. A mirror having both opaque and transflective areas provides an example of a multi-zone mirror element. The term "area" is used herein interchangeably with "zone" and refers to a region, the projection of which is contiguous in some plane.

In the context of thin-film coatings, a term "graded layer" refers to tapering of the thickness of a coating layer relative to the surface of a supporting base. (A supporting base may include a substrate and a base layer deposited thereon. A base layer in turn may include any transparent covering or coating such as a plastic film or one or more thin film layers.) For example, a graded layer deposited on a substrate has a thickness gradient, and a slope of the upper surface of such layer, corresponding to the rate of thickness change with distance. The thickness gradient may be expressed in various ways, e.g., in percent per distance. Consequently, a graded layer may have a portion of its upper surface (opposite to the lower surface facing the supporting base) that is inclined with respect to the lower surface or the surface of the supporting base.

A surface is considered inclined with respect to a reference surface if it forms an angle, with the reference surface, that is neither zero nor ninety degrees. For example, a dihedral angle formed by a reference plane and a plane inclined with respect to the reference plane is and a reference plane if the dihedral formed by these two planes angle differs from either zero or ninety degrees. An inclined surface is sloping or slanting with respect to a reference surface.

The terms "Lab color space", "L*", "a*", and "b*" refer to the CIELAB color space, specified by the International Commission on Illumination, that describes all the colors visible to the human eye. The three coordinates of CIELAB represent the lightness of color (L*=0 yields black and L*=100 indicates white), its position between red/magenta and green (a*<0 indicates greenish hue, while a*>0 indicates reddish hue), and its position between yellow and blue (b*<0 indicates bluish hue and b*>0 indicates yellowish hue).

"Contrast" generally refers to a ratio of light intensity of a signal of interest to the light intensity of the background. In context of a mirror having a display device disposed behind the mirror, e.g., the contrast of light generated by the display and reaching the viewer through the mirror may be determined by the ratio of the display light intensity reaching the viewer to that of the intensity of ambient light reflected in the mirror.

Two or more zones or areas are substantially coextensive in a chosen plane if projections of these zones onto such plane have substantially equal bounds.

The present invention provides improvements to mirror elements and mirror assemblies of the type disclosed in commonly assigned U.S. patent applications Ser. Nos. 12/138,206, 11/833,701, 11/713,849 and U.S. Pat. No. 6,700,692, all of which are incorporated herein by reference in their entirety, and may be collectively referred to herein as "Our Prior Applications."

In the design of any mirror assembly (be it a regular viewing mirror assembly or an automotive rearview mirror assembly) incorporating a display device or some auxiliary components (such as electronics) behind the mirror element of the mirror assembly, it can be advantageous to have the mirror element include a plurality of zones or regions of varying optical characteristics. For example, one region of a mirror element may be implemented to have transmittance and reflectance different from those in another region. Such varying distribution of optical characteristics may allow the display device behind the mirror to be viewed through the transmissive area. At the same time, all other components of the mirror assembly (such as, e.g., various electronics) located behind an opaque area will be hidden from the viewer. A transflective area, through which a display device positioned behind the mirror element directs light towards the front of the mirror (or through which another auxiliary component positioned behind the mirror can be seen) may be interchangeably referred to hereinafter as a "display area" of the mirror. The reflectance of such transflective area of the mirror element is generally sufficient enough for the viewer located in front of the mirror assembly to see the reflection of the ambient objects in the transflective display area. Similarly, the remaining area of the mirror that is complementary to the transflective area may be opaque (e.g., having transmittance below 5 percent, preferably below 2.5 percent, more preferably below 1 percent, and most preferably below 0.5 percent), but may have significant reflectivity for the viewer to observe the reflection of the ambient environment. Such area of the mirror element may be referred to as "opaque area." FIG. 1 schematically illustrates a concept of a multi-zone mirror element 100 having an opaque area 101 and a transflective area 102. As shown, the mirror element may be an EC-mirror element or a regular viewing mirror, provided, in the simplest case, by glass with a metallic or other reflective backing. The transmittance of the transflective display area of the mirror is preferably greater than 5 percent, more preferably greater than 10 percent, even more preferably greater than 20 percent, and most preferably greater than 30 percent. These characteristics are advantageous to the visual perception of the display by the user 112 positioned in front of the mirror, and contrast of the display that is optimal under the most frequent conditions of mirror operation.

Generally, optical characteristics of the transflective area of the mirror vary depending on the application. With respect to embodiments of a vehicular rearview mirror assembly 113, for instance, there may be a need to see the display 114 behind the mirror element 100 all the time when the vehicle is running. Such situation may arise when the display provides various telemetric or global positioning information to the driver. When an aperture or opening (created by absence of one or more layers in a thin-film stack) is present in the mirror reflector, the viewer in front of the rearview mirror assembly will be aware not only of the existence but also of the location of the display even when the display is off. In this case, the effective viewing area of the mirror element is generally reduced by the area in front of the display because such display area of the mirror element typically has reflectance substantially lower than that of the surrounding area of the mirror element. The reduction of the effective area of the mirror results in a product that may not meet the regulatory requirements, e.g., with respect to the field-of-view. The mirror would, therefore, be increased in size to have the field-of-view that meets the regulations. This may result in a mirror that is deemed too large for a given automobile and considered aesthetically undesirable. A need therefore exists to have a reflector that could function as a mirror meeting field-of-view requirements but may also have a viewable display during times when the display is active.

In one embodiment of a multi-zone mirror element that provides the maximum viewing area with minimal assembly size, the spectral distribution of transmittance of the transflective display area of the mirror may generally match the spectral distribution of intensity of the display behind the mirror. As a beneficial result of such spectral matching, the overall light throughput 116 from the display through the transflective display portion 102 of the mirror 100 may be increased. A regular viewing wall mirror having a display area may be implemented to operate in a similar mode, when the display is constantly projecting some light through the display area towards the viewer.

In comparison to the mode of operation discussed above, an alternative purpose of using the transflective area of the mirror may be to make a display behind the mirror obvious to the viewer only when the display is active (and otherwise making the mirror element appear essentially featureless). Then, a so-called "stealth" multi-zone mirror could be realized that provides a close match of the reflectance characteristics between the opaque and transflective areas, including the spectral distribution of reflectance or color, in order to optimize the perceived difference in appearances of these areas when the display is off. Various degrees of required match of optical characteristics are discussed below. Such optical matching provides an additional benefit in that the display area of the "stealth" mirror generally does not reduce the viewing portion of the mirror element. Rather, as a result of the optical matching, the viewing portion is optimized to include substantially all the reflective surface of the mirror element. Similarly, a simple viewing mirror having an information display behind it may be configured to operate in a stealth mode, as discussed below. This yields a large effective viewing area with minimal assembly size.

A transition region between the opaque and transflective areas of the mirror may be generally either abrupt or graded. Whatever the nature of the transition, both areas should be well matched optically for a mirror to operate in a stealth mode. An abrupt-edge transition may be used if the effective area of the mirror element is limited and no additional room is available for a graded transition. Alternatively, an abrupt-edge transition may be beneficially realized when a mirror assembly includes a specific area dedicated to visual indicia or warning lights. In this case, although the stealthiness of the mirror operation is maintained, there may appear a well discernable boundary identifying the specific area when visual indicia is highlighted. The abrupt-edge transition of prior art does provide an answer to the need of bridging the opaque and transflective areas while keeping the reflectance value substantially constant across the both areas. The abrupt-edge transition of prior art does not address a need to make such bridging unperceivable in a case when the different areas have significantly different reflectance values. Both abrupt and graded transitions have been considered in general terms in regard to applications of displays behind a mirror, but prior art did not recognize the problem of and did not arrive at solution addressing, e.g., the issue of change of spectral distribution of light reflected from the transition area of the mirror and that of color excursion, as discussed below. Prior art also does not anticipate the need for, or recognize the possibility of, matching the reflected appearance of a transflective and opaque area with an abrupt or hard edge. For example, U.S. Pat. No. 7,379,243 to Horsten et al. and U.S. Patent Application Publication No. 2006/0164725 to Horsten et al., discuss a simple viewing mirror that has a transflective area and that can be used for display purposes. The issue of forming a transition region between the transflective area and area complementary to the transflective area in such viewing mirror, however, is not detailed. Although a skilled artisan readily recognizes that the spatial change of optical characteristics across the multi-zone mirror element that distinguishes the transition region from either the display area or the opaque area relates to the optical coatings disposed in the transition region, a solution to having a seamless (in terms of color and reflectance) transition remains non-obvious and has not been disclosed by pertinent prior art. Embodiments of the present invention provide solutions that satisfy a long-felt need in seamless transition regions of multi-zone mirrors. Embodiments of the present invention also provide solutions that would not be reasonably expected by a skilled artisan based on the state of art.

A commonly-assigned U.S. Pat. No. 6,700,692 teaches an electrochromic mirror having coatings that simultaneously provide for significant reflectance and low transmittance in the opaque area as well as high transmittance in the transflective display area. The patent also discloses an embodiment of a reflective coating having a gradient of thickness in the area of transition between the opaque and transflective areas of the mirror. FIG. 2 schematically illustrates an embodiment of a multi-zone reflector having a graded region of transition. FIG. 2(A) shows a cross-sectional view, and FIG. 2(B) shows a front view of an embodiment 200 of a reflector assembly, wherein the mirror element 202 has an opaque area 204 and a transflective area 206. As shown, the mirror element 202 is a regular viewing mirror having a single continuous reflective layer 207 (such as a metallic layer) disposed on a transparent supporting base substrate 208. In a specific embodiment, the supporting base may be a glass substrate. A portion 209 of the reflective layer 207, disposed in the opaque area 204 of the mirror element 202, is thick enough to substantially prevent incident ambient light I from penetrating through the mirror element 202 at the area 204. The portion 210 of the reflective layer 207 at the transflective area 206 is thinner than the portion 209 and provides for a required amount of light transmission through the area 206. The transition region 211, separating the transflective display area 206 of the mirror element from its opaque area 204, is defined by a gradual change in thickness of the reflective coating 207, as shown in FIG. 2(A). A user 112 can see the light L, emanating from a display 214, through the supporting base 209 at the transflective area 206. As shown in FIG. 2(B), the embodiment of the mirror element 202 is circular and the display area 206 is completely surrounded by the opaque area 204. Particular shapes of the opaque and display areas of any embodiment of a reflector according to the present invention, however, do not affect the performance and may differ from embodiment to embodiment. For example, an overall shape of the mirror substrate may be quasi-rectangular, and the opaque area of the mirror element may be non-enclosing with respect to the transflective area. FIGS. 2(C) and 2(D) demonstrate, in front view, two alternative orientations of the opaque and transflective areas of a multi-zone reflector having a transition region. In a specific alternative embodiment and in comparison to FIGS. 2(A) and 2(B), a transition region may be formed by grading or tailoring the thickness of the reflecting layer 207 in the opposite fashion. Specifically, the thickness of the reflecting layer 207 may be graded between the higher thickness value corresponding to the peripheral area 204 and the lower thickness corresponding to the central area 206. In such a specific case, however, the area 204 becomes transflective and the area 206 becomes opaque. It will also be appreciated that profiles of the reflecting layer(s) in the opaque and transflective areas are not limited to being uniform and, in general, may be variable.

The grading approach to forming a transition between areas of the reflector has some limitations. Since the reflectivity of a given area of the mirror depends on thickness of a reflective layer in a thin-film stack, the thickness of the reflecting layer is generally adjusted to attain the desired levels of transmittance in the transflective and opaque areas. In practical applications, the reflectance difference between two area may be significant enough to inhibit the design of a stealthy mirror. For example, if a silver/gold alloy is used to fabricate a reflecting layer of the mirror having an opaque area and an area with 35 percent transmittance, the resulting reflectance difference between the two areas would be greater than about 35 percent. If the thickness of the reflecting layer is graded over a long distance, then such reflectance difference may be visually acceptable. If, in contrast, the thickness of the reflecting layer is graded over a short distance, then the difference in reflectivity between the two areas may be more perceptible to the viewer, and the mirror may lose the desired stealthy characteristics. The novel designs discussed below allow for decoupling of the reflectance and transmittance in the two zones thus allowing for greater options in reflectance at different transmittance levels.

Figure 3:
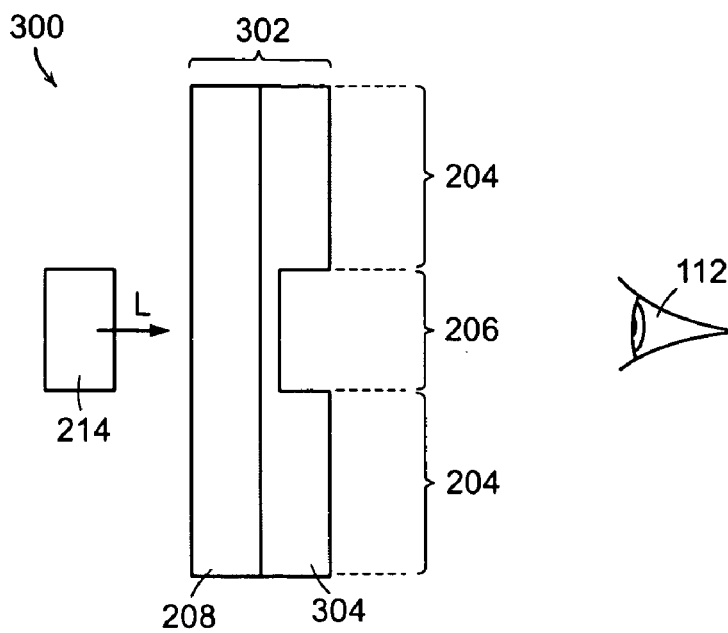
FIG. 3 schematically illustrates an embodiment of a viewing mirror assembly characterized by an abrupt (hard-edge) transition region between the opaque and display areas of a mirror element of the assembly. L: light generated by a display positioned behind the display area of the mirror element.

In comparison with FIG. 2, an embodiment 300 of the mirror assembly containing a multi-zone reflector 302 is shown in FIG. 3. The reflector 302 includes a single continuous reflecting layer 304 in both the display area 206 and the opaque area 204 and has an abrupt transition between these areas. Such abrupt transition is defined by a step-like change in thickness of the reflecting layer 304, which may be implemented by either depositing the layer 304 in two sequential steps and appropriately employing masking of the substrate, or fabricating a thick layer followed by appropriately masked etching step, as known in the art. In an even simpler implementation of a single-layer multi-zone reflector (not shown), the reflecting layer 304 may be completely absent at the display area of the mirror. The width of a transition region in either of the abovementioned cases approaches zero.

Various embodiments of mirror coatings that are more complex than those discussed in reference to FIGS. 2 and 3 are presently used in fabrication of both simple reflectors and commercially implemented complex mirror assemblies, each of which can be used as a vehicular rearview mirror. One known embodiment of the rearview mirror assembly, for example, employs an electrochromic (EC) mirror element with a 2.5" LCD rear camera display (RCD) positioned behind the mirror element so as to project a displayed image through the mirror element towards the user (e.g., the driver of the vehicle). The electrochromic mirror element may be incorporated in an inside or an outside mirror assembly. An EC-mirror assembly used inside the vehicle is usually adapted to be installed on a motor vehicle in a conventional manner to face the rear of the vehicle and to be viewed by the driver. The electrochromic mirror element may include two substrates (also referred to as lites) disposed in parallel, spaced apart relation to one another with a seal disposed therebetween around the periphery of the lites so as to form a sealed chamber. The transparent substrates of the EC-mirror element may be made of any material that is transparent and that has sufficient strength to be able to operate in conditions with varying temperatures and pressures, commonly found in the automotive environment. An electrochromic medium (EC-medium) is disposed in the sealed chamber. A second (with respect to the driver) substrate generally has a reflective layer disposed on one of its surfaces.

Figure 4:
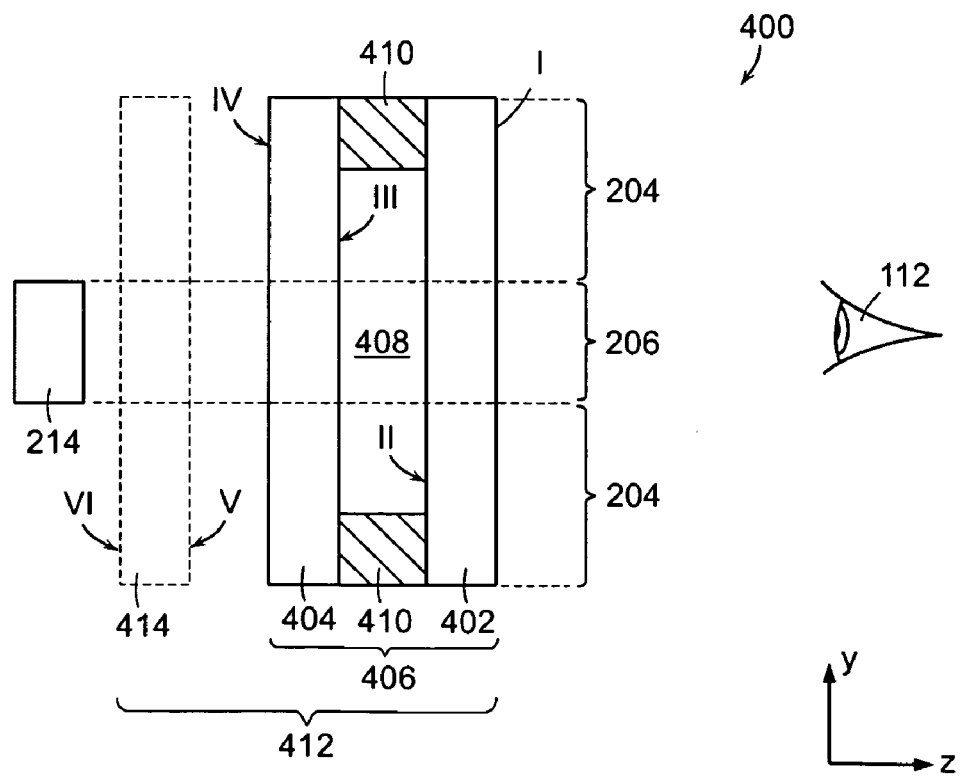
FIG. 4 illustrates a generalized embodiment of an electrochromic mirror assembly.

FIG. 4 schematically shows a multi-zone EC-mirror assembly 400. For purposes of this disclosure and the appended claims the substrate 402, positioned in front of the driver 112, is referred to as the front substrate (or a first lite). The front surface of the first lite 402, which is disposed closest to the driver 112, is referred to as the "first surface" (or surface I) of the mirror assembly 400. The rear surface of the first lite 402 is referred to as the "second surface" (or surface II), the front surface of the second lite 404 is referred to as the "third surface" (or surface III), and the rear surface of the second lite 404 is referred to as the "fourth surface" (or surface IV) of the mirror assembly 400. An elementary EC-element 406 is formed by the lites 402 and 404. The EC-medium 408 disposed within a sealed chamber defined by the lites 402, 404 and a peripheral seal 410. In a particular embodiment of the mirror element in commercial products, a reflective coating including a stack of thin-film layers may be disposed on the third and/or fourth surface of the mirror assembly. The EC-mirror element 412 may include, in addition to the elementary EC-element 406, auxiliary lites of glass (such as a lite 414 shown in a dashed line) and auxiliary coatings (not shown). In such a case, all the additional surfaces are numbered accordingly, from the viewer 112 towards the outermost rear surface, as shown in FIG. 2 in Roman numerals. A display 214 such as an RCD is shown to be positioned behind the mirror element 412. For simplicity of illustration, various conductive layers, generally provided on the inside surfaces of the transparent substrates 402 and 404 (i.e., surfaces II and III), as well as auxiliary reflective, opaque, and semi-transparent coatings that facilitate the desired optical characteristics of the mirror, are not shown in FIG. 4. In a typical elementary EC-mirror element 406, the conductive layers on both the first and second lites are connected to electronic circuitry (not shown), which is effective to electrically energize the EC-medium to switch the EC-medium to vary its transmittance.

A typical current commercial EC-mirror assembly utilizing an RCD, includes two lites of glass and a reflector stack fabricated on surface III. The third surface of such commercial mirror contains a quarter-wave-thick dielectric stack including $TiO_2$ and indium-tin-oxide (ITO) layers and a silver alloy layer deposited on top of the quarter-wave stack. Both the quarter-wave-thick stack and the silver alloy layer are deposited across all of the third surface. Generally, the silver alloy refers to silver (Ag) doped with gold (Au) or another element or elements in any predetermined ratio. For example, in some embodiments, the silver alloy may contain about 7% of gold by weight, in which case the alloy may be denoted as 7X silver alloy or 7Au93Ag. The reflector stack used in the current commercial product is uniform across the third surface and has approximately 63 percent reflectance and 25 percent transmittance at any point across the stack. Because high transmittance is not desirable in the opaque area of the mirror, an opaque black plastic appliqué is additionally disposed in the opaque area between the fourth surface and the circuit board (or other components) located behind the mirror to hide them and make them invisible to the viewer. In practice, such appliqué backing is both expensive and difficult to apply cleanly: any wrinkles or bubbles in the appliqué are plainly visible through the reflective coating, which affects the yield of the product. In each and every embodiment discussed herein, thin-film deposition is carried out using methods such as physical vapor deposition, evaporations, DC-megatron sputtering, RF-sputtering, or other methods known in the art. Gradation of layer thicknesses can be achieved using, for example, using a knife-edge procedure where a blocker shielding a substrate from deposition of a material being sputtered is moved out of the way to increase the area of the substrate exposed to the depositing material. Fabrication of embodiments of the invention will be addressed below in more detail.

An undesirable characteristic of multi-zone mirrors of the prior art is the variation of color and intensity of image, observed in reflection across the surface of the mirror. Occurrence of such variation of color and intensity has been neither anticipated nor recognized in the prior art, and no resolution of this problem has been proposed. Embodiments of the present application address the need for uniform color, and in some embodiments, reflectance, and provide thin-film stack combinations that yield color and reflectance transitions, across the surface of the mirror, acceptable for the intended use of the mirror. It will be appreciated that, in context of the embodiments of the invention, the spatial change of any optical characteristic of a mirror element (such as spatial transition of color, reflectance, or transmittance) is addressed without any reference to a particular geometrical orientation across the surface of the mirror element. For instance, the matching of color and reflectance values between various areas of any embodiment is considered along any direction that represents a transition between two neighboring areas of the mirror element, and that depends only on mutual positioning of corresponding areas within the boundaries of the mirror element.

Abrupt Transition Between the Opaque and Transflective Areas of the Mirror.

Our Prior Applications disclose various mirror coatings that allow the user to form a multi-zone mirror element without utilizing the appliqué backing. These embodiments include an "opacifying" layer as part of the thin-film stack covering the third surface in the opaque area of the mirror element. The opacifying layer performs a function similar to that of the appliqué on the fourth surface in that it substantially reduces the transmittance of the mirror element outside of the transflective display area (e.g., down to less than 5 percent, preferably less than 2.5 percent, more preferably less than 1 percent and most preferably less than 0.5 percent) and, at the same time, it does not substantially affect the transmittance of the mirror element at the display area. As a result, in the embodiments containing the opacifying layer, the appliqué backing of the reflector can be eliminated. Our Prior Applications further disclose some specific embodiments that utilize a so-called "split" reflector stack, which in some embodiments may provide additional advantages in reducing the transparency of the opaque area of the mirror element. In the opaque area, a split reflector coating includes an opacifying layer sandwiched between two reflecting layers (the lower and upper reflecting layers made of the same or different reflecting materials), and has even lower transmittance than a combination of a single reflecting layer on top of the opacifying layer. In the transflective area of the mirror, however, the opacifying layer is generally absent and the split reflector coating includes the lower and upper reflecting layers that combine and have a common surface. In specific embodiments of the invention discussed below, the split reflector design may be advantageous in that it allows the user to vary reflectance and transmittance values of the transflective and opaque areas of the reflector independently from one another. In addition, by "splitting" the reflecting layers in the opaque area of the mirror, the user attains the ability to match reflectance values of the opaque and transflective areas over a broad range of reflectance levels. In specific embodiments, additional thin-film layers may be deposited under or over the split reflecting layers in any of the opaque or transflective areas of the mirror to beneficially modify or tune at least one of the spectral distribution of reflectance (for simplicity referred to hereinafter as color) and the value of reflectance in a corresponding area. Such tuning allows the user to achieve an even better optical match between the opaque and transflective areas in order to optimize the stealthy performance of the mirror. In addition or alternatively, the adjoining of underlayers or overlayers to the reflecting layers in either area may optimize physical characteristics of the coatings such as, e.g., physical durability.

Several examples of beneficial implementations of a split reflector design in embodiments of a multi-zone reflector are discussed below. Although these examples are provided mostly with respect to embodiments of an autodimming mirror such as EC-mirror, it should be appreciated that the embodiments are not limited to multi-zone EC-mirrors, but include other types of mirrors that are used for viewing reflected and displayed images. As examples one may think of a large mirror such as a bathroom mirror, in which part of the mirror surface is used for display purposes, or a simple viewing mirror such as a prismatic rearview automotive mirror having a transflective region, through which an object or display positioned behind the mirror can be seen, or even a mirrored wall a portion of which is used for display purposes.

Any multi-zone mirror or reflector is within the scope of the invention. Although a particular embodiment of a multi-zone EC-mirror illustrated in Figures below may show some of the thin-film coating layers being deposited up to the very edge of the underlying substrate and possibly extending under the seal of the mirror, such geometry shall not be viewed as limiting a particular embodiment. For example, as taught in U.S. Pat. No. 6,700,692, various layers may extend further than the seal, e.g., under the seal all the way to the edge of the substrate, or, alternatively, may extend only partly under the seal or not extend under the seal at all. Such variations in layer extent across the area of any reflector may be introduced for various reasons such as those related to establishing an electrical contact with a coating layer or optimizing the durability of the overall device. Moreover, a thin-film layer that extends under an opacifying layer, as discussed below, in some embodiments may be omitted or thinned in a particular area under the opacifying layer without affecting the optical performance of the device in the particular area to a degree discernable and/or objectionable to the typical observer.

Figure 5:
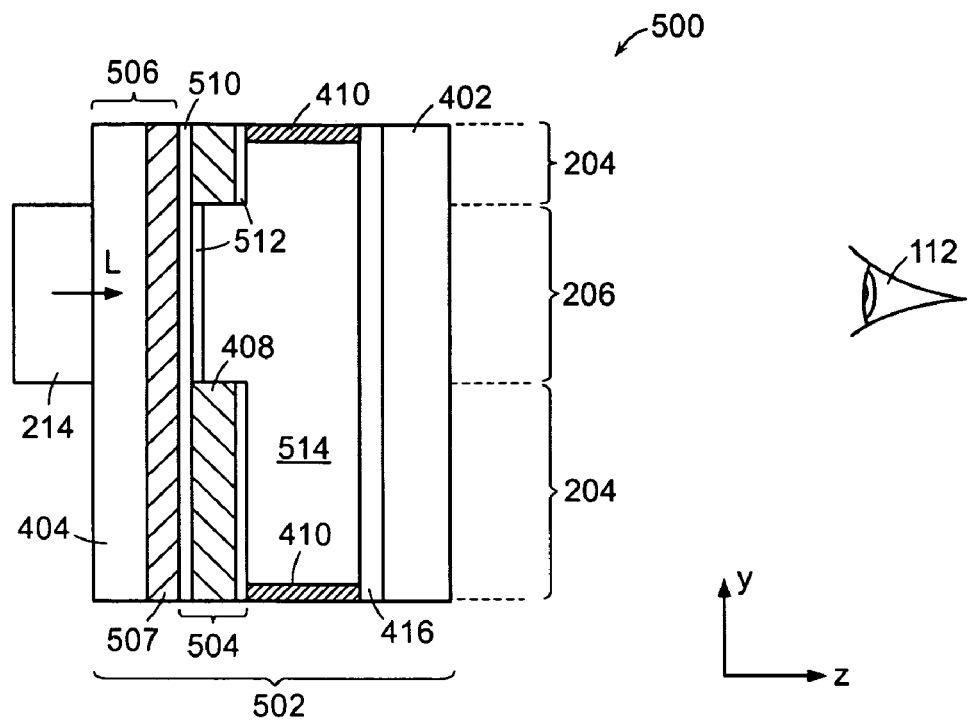
FIG. 5 provides a cross-sectional view of an electrochromic mirror assembly, in which a multi-zone mirror element includes an abrupt transition between the opaque and display areas of the mirror element.

FIG. 5 schematically illustrates a coating structure utilizing a split reflector stack in an embodiment 500 of an EC-mirror assembly having an abrupt (or hard-edge) transition between coatings, which defines the opaque area 204 and the display area 206. In this embodiment, a split reflector stack 504 is formed on top of a supporting base 506. The supporting base 506 includes a base layer 507 that is disposed on the third surface of the EC-mirror 502. The split reflector 504 includes, at the opaque area 206, an opacifying layer 508 sandwiched between two reflecting layers (a lower layer 510 and an upper layer 512). As shown, there is no opacifying layer 508 at the display area 206 of the mirror, i.e. the opacifying layer includes an aperture at the transflective area 206 of the embodiment 500. In the transflective area 206, therefore, the layers 510 and 512 (that may be made of silver alloy or other materials described below) are deposited on top of one another and have a common surface over at least a portion of the transflective zone.

While the reflecting layer 510 disposed between the opacifying layer 508 and the supporting base 506 is continuous across the area of the embodiment 500, the reflecting layer 512 that extends over the opacifying layer 508 and the transflective area 206 has a discontinuity at the abrupt transition between the opaque and transflective areas of the mirror 502. Together with the supporting base 506, the combined layers 510 and 612 define optical properties of the transflective area of the mirror 502. The optical properties of the opaque area, on the other hand, are controlled to a great extent by the thickness of the upper reflecting layer 512 and the choice of opacifying material for the layer 508. Because, as shown, the transition from the opaque region to the transflective area is abrupt, in order for the display 214 to remain stealthy the reflectance and color must be very closely matched between the areas of the multi-zone mirror 502. As shown in FIG. 5, layers disposed under the opacifying layer 508 (such as base layer 507 or even the lower reflective layer 510) cover the majority of the entire third surface. It shall be appreciated, however, that in specific embodiments such underlying layers may be present mainly in the transflective area 506 with minimal extension under the opacifying layer 508. Indeed, a contribution of the base layer 507, disposed under the high optical density opacifying layer 508, to the reflectance of the opaque area is minimal. In a specific embodiment, however, it may be beneficial, however, to extend the base layer 507 somewhat beyond the transflective area and below the opaque layer 508 to simplify manufacturing process by increasing tolerances on mask-positioning. In further reference to FIG.

5, a chamber containing the electrochromic medium 514 is formed by the peripheral seal 410 and the first and second substrates 402 and 404. A layer 516 of indium-tin-oxide (ITO) is disposed on surface II and provides an electrical contact between the circuitry (not shown) and the electrochromic medium 514.

Example 1

In one specific embodiment of the EC-mirror of FIG. 5, a base layer 507 may be formed as a quarter-wave bi-layer by first depositing a 48 nm thick layer of titania (TiO$_2$) and overcoating it with a 18 nm thick layer of ITO. Both substrates 402 and 404 may be made of 1.6 mm thick glass plates. The lower continuous reflecting layer 510 that is 14.4 nm thick is made of 7X-silver alloy. The 50 nm thick opacifying layer 508 is composed of Chromium, and the upper reflecting layer 512 of 7X-silver alloy is 6.5 nm thick. The EC-medium 514 fills a 135-micron-thick chamber, and the ITO layer 516 is 145 nm thick. The presence of the base bi-layer 507 facilitates the increase in reflectance and tuning of color at the transflective area 206 by balancing the spectral change of reflectance introduced by the silver alloy layer. In addition, the base bi-layer 507 improves the stability and adhesion of the silver alloy layer. Optical characteristics of the embodiment 500 are summarized in Table 1. It can bee seen that both the reflectance values and the color gamut of the transflective and opaque areas of the mirror are substantially matched.

TABLE 1

| | Transmittance, % | Reflectance, % | a* (in reflection) | b* (in reflection) |
|---|---|---|---|---|
| Opaque Area, 204 | 0.2 | 60.1 | −3.1 | 1.8 |
| Transflective Area, 206 | 27.7 | 60.1 | −2.8 | 2.9 |

Example 2

Figure 6:
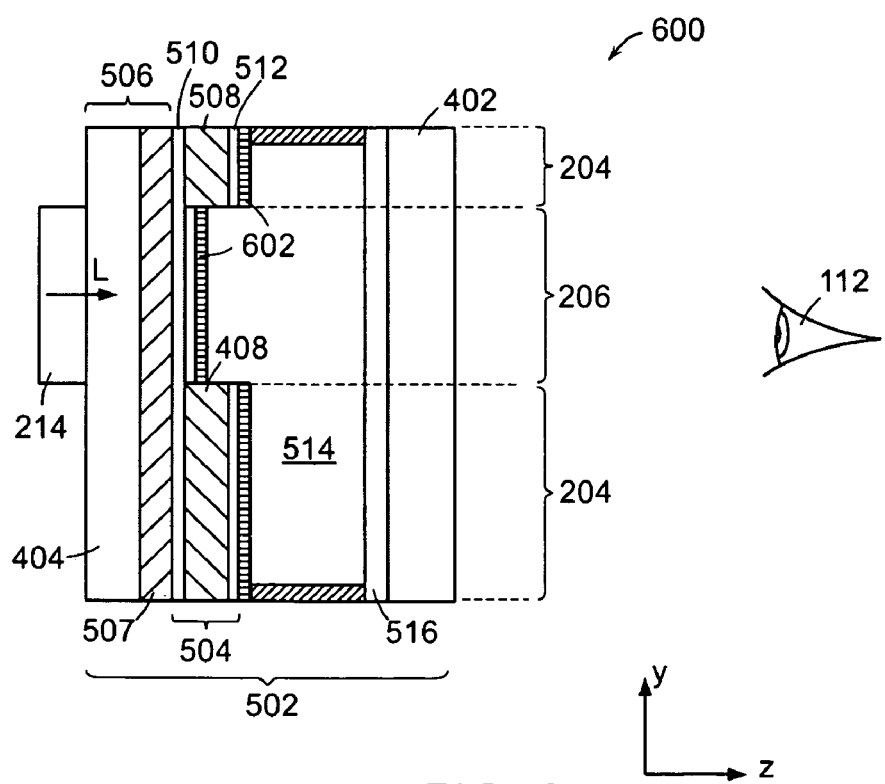
FIG. 6 is a cross-sectional view of another embodiment of an electrochromic mirror assembly, in which a mirror element includes an abrupt transition between the opaque and display areas of the mirror element.

An alternative embodiment 600 of a multi-zone EC-mirror employing a split reflector on the third surface is shown in FIG. 6. This embodiment includes the structure similar to that described above in reference to FIG. 5, and, in addition, incorporates a 10 nm thick flash layer 602 of ITO on top of the upper reflecting layer 512 in order to augment the stability and durability of the silver alloy layer 512 extending over the opacifying layer 508. In addition, the flash layer 602 of the ITO tunes color in reflection of incident light. Optical characteristics of this embodiment are summarized in Table 2. Other transparent conductive oxides besides ITO (such as, e.g., aluminum-doped zinc oxide, fluorine-doped tin oxide and indium zinc oxide) may be used for fabricating an overcoating flash layer 602. U.S. Pat. No. 6,700,692, the disclosure of which is incorporated herein in its entirety, provides examples of using not only transparent conductive oxides but also thin metallic layers (with thicknesses below about 300 angstroms) as flash layers.

TABLE 2

| | Transmittance, % | Reflectance, % | a* (in reflection) | b* (in reflection) |
|---|---|---|---|---|
| Opaque Area, 204 | 0.3 | 65.1 | −2.9 | 4.4 |
| Transflective Area, 206 | 21.9 | 65.0 | −2.8 | 5.2 |

Example 3

The split reflector design can also be advantageously used to obtain a reflector having two transflective areas of differing transmittance values but substantially equal reflectance values. Two transflective areas may be required, for example, in a mirror assembly utilizing two displays of different brightness values. Referring again to the structure depicted in FIG. 5, in a specific embodiment of this Example, both areas 204 and 206 can be transflective. The reflector on the third surface of the mirror may include, in order of deposition, a quarter-wave bi-layer 507 consisting of 48 nm of titania and 18 nm of ITO, a lower continuous reflecting layer 510 of 7X-silver alloy (19.05 nm), a 1 nm thick opacifying layer 508 of Ruthenium at the opaque area 204 of the mirror, and an upper layer 512 of 7X-silver alloy (1.85 nm thick) that extends over both the Ruthenium layer 508 and the lower silver alloy layer 510. The constant (across the mirror) value of reflectance may be maintained by selecting the appropriate thickness of silver alloy layers 510 and 512. Optical characteristics of this embodiment are summarized in Table 3. It can be seen that the transmittance of the area 204 is reduced, as compared to that of the area 206, by approximately 6 percent. The transmittance value can be further reduced by increasing the thickness of the ruthenium layer 408.

TABLE 3

| | Transmittance, % | Reflectance, % | a* (in reflection) | b* (in reflection) |
|---|---|---|---|---|
| First Transflective Area (area 204) | 33.0 | 55.2 | −2.9 | 4.4 |
| Second Transflective Area (area 206 | 27.1 | 55.1 | −2.8 | 5.2 |

Example 4

Figure 7A:
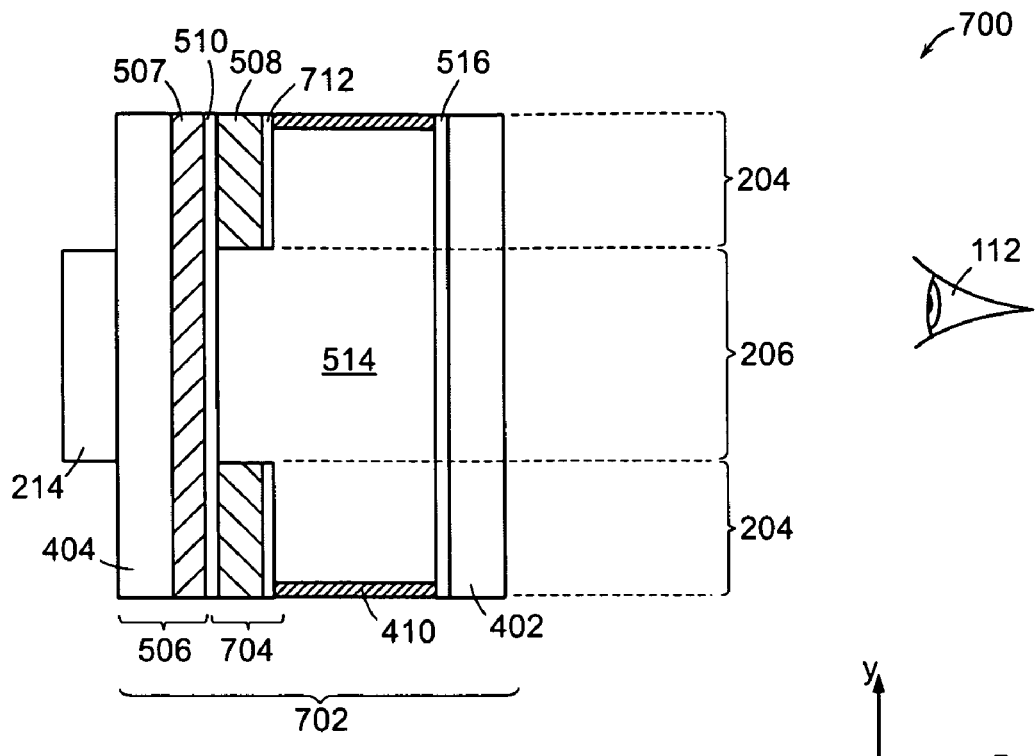
FIG. 7 shows cross-sectional views of alternative embodiments of an electrochromic mirror assembly, in which a mirror element includes an abrupt transition between the opaque and display areas of the mirror element. (A): modified split reflector; (B): single reflecting layer.

An alternative embodiment 700 of an EC-mirror having a split reflector on the third surface, schematically shown in FIG. 7(A), also provides a sharp transition from the opaque area 204 to the transflective area 206. The implementation of a split reflector 702 in this embodiment is simplified in that the upper discontinuous reflecting layer 712 is extending over only the opacifying layer 508 at the opaque area 204 of the mirror element. The upper layer 712 is not present at the transflective area 206 of the mirror. This fact, however, does not reduce the overall reflectance of the embodiment of the reflector because optical properties of the materials chosen for fabrication of this thin-film stack compensate for the absence of the upper reflecting layer 712 from the transflective area. Specifically, as shown, the 30 nm thick Chromium opacifying layer 508 is sandwiched between the 4.75 nm thick continuous layer 510 of Ruthenium and the discontinuous 10 nm thick layer 712 of Ruthenium. The split-reflector stack 704 extends over the base layer 507 made of semiconductor material (29.3 nm of Silicon, disposed adjacent the third surface of the reflector). The use of a semiconductor material for the base layer 507 results in lower level of absorption as compared to a metallic base layer. Both glass substrates 402 and 404 are 1.6 mm thick, and the second surface of the embodiment is overcoated with a 145 nm thick layer of ITO. Optical characteristics of this embodiment are summarized in Table 4. This embodiment may be further modified to attain other beneficial characteristics. For example, the cost of the embodiment may be reduced by minimizing the use of Ruthenium and depositing the layer 510 it only in the transflective area 206. Also, because the switching speed of an EC-mirror depends, in part, on the sheet resistance of the thin-film stack involved in fabrication of the EC-mirror, the sheet resistance of a particular embodiment can be tailored as required by adjusting the thickness of the opacifying layer 508.

TABLE 4

|  | Transmittance, % | Reflectance, % | a* (in reflection) | b* (in reflection) |
|---|---|---|---|---|
| Opaque Area, 204 | 0.3 | 55.3 | −3.0 | 2.1 |
| Transflective Area, 206 | 15.0 | 55.3 | −3.0 | 2.0 |

It will be appreciated that, generally, the stealthy performance of a multi-zone mirror can be adversely affected by manufacturing tolerances related to the control of thicknesses of layer forming the coatings in either of the zones of the mirror. The manufacturing tolerances are increased when "stealth" features are not extremely critical. One of examples of zone matching in a multi-zone mirror may be provided by appearance matching implemented to visually merge the viewing area of an EC-mirror and the peripheral area of such mirror at which the seal and/or curable plug is disposed. Embodiments of such matching have been disclosed, e.g., in commonly-assigned patent application Ser. No. 12/154,824 and U.S. Pat. Nos. 7,417,781, 7,042,616, 7,209,277, or U.S. Pat. Nos. 7,064,882, 7,372,611, 7,379,225, 7,324,261, 7,349,143, 7,477,439 and patent application Ser. Nos. 11/478,224, 12/151,669, 12/154,736. The disclosure of each of these patent documents is incorporated herein by reference in its entirety.

Figure 7B:
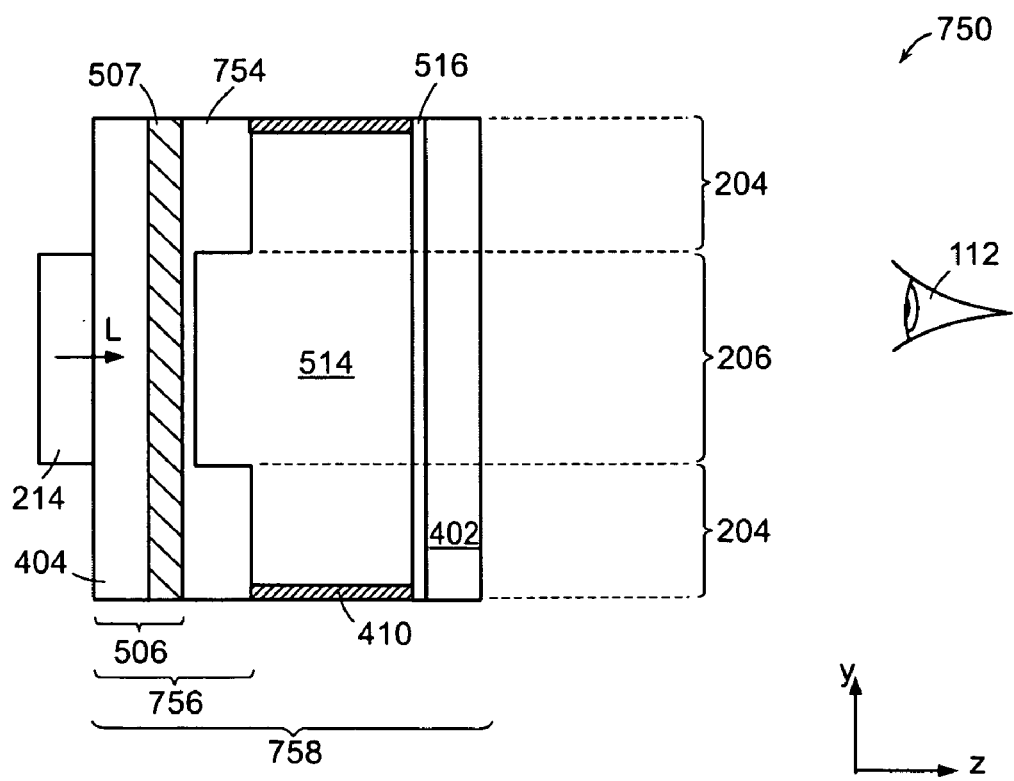

As was discussed earlier in reference to FIG. 3, different areas of a multi-zone reflector can be implemented with a use of a single reflecting layer on top of a supporting base. An embodiment 750 of FIG. 7(B) provides an example of such implementation. The embodiment 750 was structured in a fashion similar to that of the embodiment 300 of FIG. 3 and has a continuous Ruthenium reflecting layer 754, deposited on the supporting base 506 including an approximately 22 nm thick layer 507 of Silicon on the glass substrate 404. The reflecting layer 754 is disposed across substantially all of the third surface of the embodiment 750, and defines an abrupt transition between the opaque and transflective areas 204 and 206 by a step-like change in thickness of the reflecting layer 754. The step-like change in thickness was made possible by deposition about 7 nm of Ruthenium across the surface of the supporting base 506, followed by a conventional masking of the transflective area 206 and additional deposition of about 40 nm of Ruthenium in the unmasked regions. The width of a transition region in the embodiment 750 approaches zero. The optical characteristics of the reflector 756, which includes the second lite 404 and the thin-film layers 507 and 754, are summarized in Table 5.

TABLE 5

|  | Opaque Area, 204 | Transflective Area, 206 |
|---|---|---|
| Transmittance, % | 0.05 | 8.3 |
| Reflectance, % | 69.4 | 71.9 |
| a* (in reflection) | −0.03 | −1.34 |
| b* (in reflection) | 1.05 | 0.85 |
| L* (in reflection) | 86.68 | 87.90 |
| a* (in transmission) | 0.54 | 2.60 |
| b* (in transmission) | 0.59 | 17.06 |
| L* (in transmission) | 0.47 | 34.59 |

The reflector 756 was further assembled into an EC-mirror element 758, having a first lite of glass 402 coated, on the second surface, with about a half-wave-thick layer of ITO. The EC-mirror element 756 was further incorporated into an EC rearview mirror assembly for use in a vehicle, according to other teachings of Our Prior Applications. Optical characteristics of the completed EC-mirror element 756 are summarized in Table 6.

The hard edge designs described above address the unrecognized and unforeseen need in the art to that match the reflectance intensity and/or color between multiple transflective areas or transflective and opaque areas of a multi-zone reflector. The prior art, though describing some different masking options in fabricating multi-zone mirrors, did not anticipate the need for optimal aesthetic appearance of the overall multi-zone mirror demanded by commercial markets. The aforementioned hard edge designs were developed for applications where the matching of reflectance and color is required between multiple areas of a mirror. In other applications, different reflectance and transmittance (and optionally color) values may be required in different zones. In such applications, the use of the hard-edge technology will result in abrupt transitions and loss of stealthy characteristics. The graded coating approach allows two or more zones to have differing reflectance (and color) and transmittance values without sacrificing stealthy characteristics. The gradual change in reflectivity and color are not perceived the same as abrupt transitions resulting in improved aesthetics.

TABLE 6

|  | Opaque Area, 204 | Transflective Area, 206 |
|---|---|---|
| Transmittance, % | 0.7 | 11.2 |
| Reflectance, % | 59.7 | 62.0 |
| a* (in reflection) | −1.73 | −3.62 |
| b* (in reflection) | 3.32 | 2.92 |
| L* (in reflection) | 81.67 | 82.91 |
| a* (in transmission) | 0.62 | 1.91 |
| b* (in transmission) | 0.78 | 19.66 |
| L* (in transmission) | 0.60 | 39.94 |

Gradual Transition Between the Opaque and Transflective Areas of the Mirror.

As mentioned above, a multi-zone mirror element can be advantageously implemented with the use of graded coating layers, including graded opacifying layers. The grading (or, spatial tailoring) of a thin-film coating between the opaque and transflective areas of the mirror element results in a graded transition region separating the opaque and transflective areas and is characterized by optical properties varying as a function of position across such transition region.

On one hand, a graded transition region proves to be beneficial by providing a gradual change in reflectance and/or transmittance between the opaque and transflective areas, which is difficult for a human eye to perceive. Such gradual change of optical properties eliminates the abrupt visually perceivable discontinuity between the areas. Moreover, in specific cases disclosed below, a graded transition region may even assure reflectance and color gamut in reflected light that are uniform across the surface of a multi-zone reflector. The graded transition may be generally linear or curvilinear. To facilitate an unperceivable transition between the opaque and transflective areas, the distance over which the grading of the coating layers takes place depends on the type of the grade. In some embodiments, for example, the grading distance may directly depend upon the reflectance between the two regions: the higher the reflectance difference, the longer the grading distance. In alternative embodiments, the length of the grade in coating layers may also depend on intended use and illumination conditions. Moreover, the grading of the optical coatings may compensate for change in brightness (of the display behind the transflective region) as a function of the viewing angle at which the user looks at the mirror.

On the other hand, grading of optical coatings in the transition region typically produces unwanted chromatic effects. The spatial variation of color across the transition region (including spectral distribution of reflectance and transmittance) is directly related to the variation of thicknesses of the graded layers, and often manifests in unwanted color excursions (e.g., yellow hue) in the transition region. Such color excursions effectively defeat the idea of seamless visual transition between the regions of the mirror that graded transition region is designed to achieve. Embodiments of the present invention offer solutions to compensating such color excursions by gradual spatial matching of spectral contents of light reflected from the opaque and display areas. Such compensation may be accomplished, in general, by choosing appropriate coating materials, controlling relative thickness ratios of the individual layers and employing multiple opacifying layers with different spatial extent.

Figure 14:
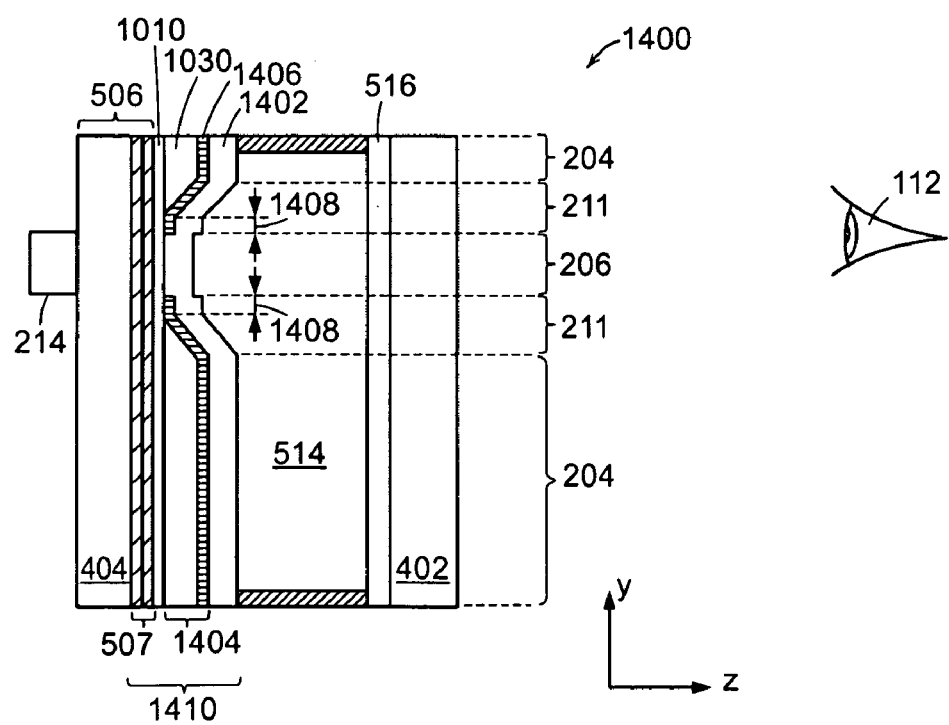
FIG. 14 shows a cross-sectional view of another alternative embodiment of an electrochromic mirror assembly, in which a mirror element includes a graded transition between the opaque and display areas of the mirror element.

In specific embodiments, it may be advantageous to extend the graded opacifying layer into the transflective area of the mirror and to terminate such layer at non-zero thickness. This prevents unwanted (and sometimes unpredictable) changes in optical properties of the third-surface thin-film stack that may arise due to oxidization of the very thin portions of the opacifying layer that may happen either during the deposition process or in subsequent processing steps. For example, in comparison with Ruthenium (which does not tend to oxidize during deposition of even very thin layers), Molybdenum and Chromium are prone to oxidization and, therefore, to changing the properties of the thin-film stack. In utilizing a Molybdenum or Chromium opacifying layer, therefore, it may be prudent not to grade its thickness all the way to zero. Additionally, if Molybdenum is partially oxidizes. the transition zone can have an unwanted yellow excursion observed across the transition region in reflection. Moreover, grading the thickness of the opacifying layer down from its maximum value in the opaque area to a non-zero thickness in the display area may in some cases yield a smaller $\Delta E^*$ between the display and opaque areas. In the case of multiple opacifier layers (such as the embodiment discussed below in reference to FIG. 14), it may be advantageous to offset the end points of various opacifying layers and thus tailor graded transitions to enable better color, reflectance and transmittance control in the transition region. Moreover, offsetting the end points of various opacifying layers by, e.g., extending one of them into the transflective area effectively forms a thin absorbing layer within the transflective area that can be employed to lower the transmittance of the transflective area as required.

Figure 8:
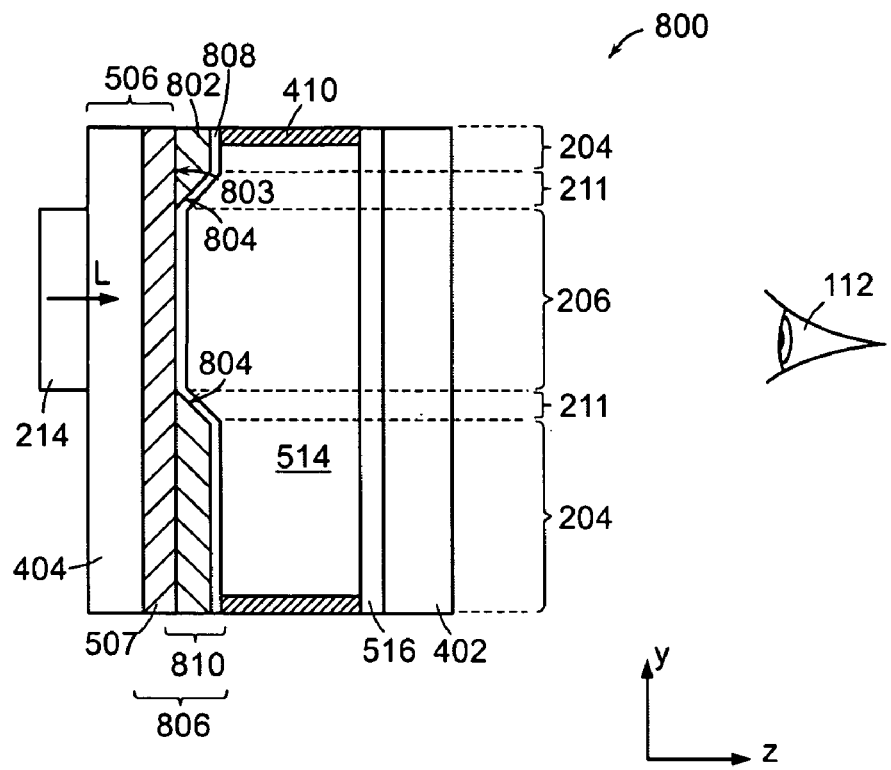
FIG. 8 shows a cross-sectional view of an embodiment of an electrochromic mirror assembly, in which a mirror element is characterized by a graded transition between the opaque and display areas of the mirror element.

FIG. 8 schematically illustrates, in side view, an embodiment 800 of a multi-zone EC-mirror having a gradual transition region 211 between the opaque and display areas, 204 and 206, respectively. The structure illustrated in FIG. 8 is referred hereinafter as gradient opacifier design. As shown, an opacifying layer 802 that may be disposed outside of the transflective area 206 and have a lower surface 803 facing the supporting base 506. The supporting base 506 may include a base bi-layer 507 adjacent the second lite of glass 404. The upper surface 804 of the opacifying layer, opposite the lower surface 803, may be beveled at an obtuse angle with respect to the third surface of the mirror embodiment 800. Consequently, the upper surface 804 has a portion that is inclined with respect to the lower surface 803. The upper surface of the graded opacifying layer 802 is sloped outwardly in the direction away from the transflective area 206 to provide for graded thickness of the opacifying layer 802. An upper continuous reflective layer 808 such as a layer of silver alloy extends over substantially all of the opacifying layer 802 and the transflective area 206 of the mirror 806. As discussed above, optional thin-film underlayers or overlayers (not shown) may be additionally disposed either above or below the opacifying layer 808 or on top of the reflecting layers 810 to modify color, reflectance, or some other property of the overall coating stack of the third surface. In the transitional region 211 defined by the slope of the surface 804, the thickness of the opacifying layer 802 is tailored from about a zero value at the boundary of the transflective display area 206 to a predetermined full thickness of the layer 802 in the opaque area 204. It shall be appreciated that embodiments of the present invention may utilize a functionally different shape of the transitional region 211. In general, the change of the thickness of the opacifying layer may be expressed by a curvilinear function, for example a function described by an equation of the fifth degree. In a specific embodiment, depending on the type of masking used in fabrication of the opacifying layer, the opacifying layer 802 may have an asymptotic tail defining the thickness of the layer that extends into the display area. The issues of layer fabrication are described in more detail below. In general, the reflectance of the third surface thin-film stack 806 decreases as the thickness of the opacifying layer is reduced, accompanied by the shift of the spectral distribution or color of the reflectance as discussed below with respect to FIG. 12. The described approach to tailoring the thickness of the opacifying layer 802 in the transition region 211 may be advantageously used to achieve the gradual spatial change in reflectance and color of the overall stack of coatings on the third surface across the transition region of the mirror. Besides making the boundary between the areas of the mirror visually unperceivable, the spatial grading of the optical properties of the transition region facilitates the stealthy appearance of the display 214 behind the mirror and allows the user to adjust the reflectance of the opaque area to a value differing from that of a transflective area and, in a specific embodiment, exceeding it. Changes in the absolute difference in reflectance between the two zones may be obtained by adjusting the overall thickness of the upper reflecting layer or by choice of opacifying material or by the inclusion of additional layers.

The difference in reflectance values of the opaque and transflective areas of the mirror depends, in part, on the optical and geometrical characteristics of the opacifying layer relative to glass or any base layers employed in a particular design. It is recognized in the art that the optical constants of materials vary somewhat with deposition methods and conditions employed. These variations can have a substantial effect on the actual optical values and optimal geometries of the layers used to attain predetermined reflectance values for a given coating stack. Specific embodiment, described below, provide examples of how the choice of materials used in the third surface stack affects its optical properties.

Example 5

In reference to FIG. 8, a specific embodiment of a third surface stack 806 within the transflective area 106 may include a base bi-layer 507 (including 50 nm of $TiO_2$ and 21 nm of ITO, deposited in that order on the 1.6. mm thick plate of glass 204) covered by the 17.3. nm layer of 7X-silver alloy. Optical characteristics of thus formed supporting base 506 may include reflectance of 55.2%, transmittance 33.0%, and a reflected color gamut of ($a^*=-3.3$; $b^*=3.1$). The addition of the Molybdenum opacifying layer 802 (that has thickness increasing at a first rate, with displacement from a transflective area in a direction to the opaque area, from approximately zero to its full thickness of 40 nm) and a 17.3 nm thick silver alloy overlayer 808 (that continuously extends across the area of the reflector) results in a multi-zone reflector that includes a thin-film stack 810 deposited atop of the supporting base 506. Optical characteristics of such reflector as shown in Table 7. The difference between reflectance values of the opaque and transflective areas, which also significantly depends on the thickness of the reflective layer 808, is "spread" across the gradual transition region 211. As a result, the boundary between the zones of the mirror becomes difficult to perceive. It shall be appreciated that thicker silver alloy layer 808 would result in a smaller reflectance difference, while thinner silver alloy layer 808 would result in a larger reflectance difference.

TABLE 7

| | Transmittance, % | Reflectance, % | $a^*$ (in reflection) | $b^*$ (in reflection) |
|---|---|---|---|---|
| Opaque Area, 204 | 0.7 | 72.3 | −2.6 | 5.1 |
| Transflective Area, 206 | 33.0 | 55.2 | −3.3 | 3.1 |

Additional specific embodiments, employing the structure of FIG. 8, are described by the parameters listed in Table 8. Here, several material choices are considered for the 40 nm thick opacifying layer 802 to be considered in a combination with the 17.3. nm thick silver alloy reflective layer 808. The rest of the material and geometric parameters are the same as in the Example 5.

TABLE 8

| Opacifying Material, 40 nm | Reflectance of Opaque Area (%) | $a^*$ (in reflection) | $b^*$ (in reflection) |
|---|---|---|---|
| None | 55.2 | −3.3 | 3.1 |
| Molybdenum | 72.3 | −2.6 | 5.1 |
| Ruthenium | 76.3 | −3.1 | 4.1 |
| Chromium | 73.8 | −3.1 | 3.7 |
| Nickel/Chromium (80%/20%) | 73.9 | −2.9 | 6.0 |
| Rhenium | 68.3 | −2.0 | 5.4 |

As can be seen from the Table 8, the color gamut of the opaque area in reflected ambient light also depends on the choice of opacifying material. Too large a color difference (which, for the purposes of this description is defined in units of $\Delta E^* = \sqrt{(L_1^* - L_2^*)^2 + (a_1^* - a_2^*)^2 + (b_1^* - b_2^*)^2}$) between the opaque and transflective areas can lead to a non-stealthy mirror element. Embodiments of the gradient opacifier design discussed above in reference to FIG. 8 impose practical limitations on fabricating a multi-zone mirror element. On one hand, the difference in reflectance between the opaque and transflective areas in this design is, to some extent, controlled by the choice of opacifying material. On the other hand, the transmittance value within some portions of the transition region between the fully opaque and transflective areas may remain relatively high (as shown in Table 5, the transmittance may change across the transition region from 33 percent to 0.7 percent), and, therefore, there would exist a portion of the reflector between the display area and opaque area that may be insufficiently opaque for the intended use of the mirror. This can potentially lead to a situation where the assembly features behind the mirror element become visible through a portion of the transition region, leading to a less aesthetically pleasing product. Additional opacifying means, such as appliqués on the fourth surface may therefore be desired to provide all needed opacification, when this design is used.

The width of the transition region is designed to create a transition in reflectance and/or color between the transflective and opaque zones gradual enough that the change is not obvious or is less obvious to an observer. The width of the transition region between the opaque and transflective area of a multi-zone reflector can be adjusted. It may be preferred to minimize the spatial extent of the transition region in order to adequately hide non-display features behind the element. The difference in appearances between two or more areas of a multi-zone mirror element may be quantified using the color metrics of $\Delta C^*$, $\Delta L^*$, $\Delta a^*$, $\Delta b^*$, $\Delta E^*$ of the CIELAB color system. In the embodiments where stealthy appearance of the mirror assembly is desired, the color difference (defined in terms of the delta quantities above and especially $\Delta E^*$) between the regions that are separated with a hard-edge transition is preferably less than 5 units, more preferably less than 3 units and most preferably less than 1 unit. In the case of a gradual transition, the rate of change of the color between the opaque and display areas can be expressed as change of the value per unit length, e.g., change of the value per centimeter. Preferably, the average rate of change of $\Delta E^*$ across the graded transition is less than 10 units/cm, preferably less than 5 units/cm, more preferably less than 2.5 units/cm, even more preferably less than 1 unit/cm, and most preferably less than 0.5 units/cm. Although discontinuities in the color transition are not desirable and the transition should be preferably monotonic, discontinuities or reversal of color on a short length scale are included within the scope of the invention as long as the rate of change of $\Delta E^*$ or the other color metrics across the graded transition remains within the preferred ranges. It is also preferred that there is no reversal in a given change of color across the graded region. However, if such a reversal is present, the color difference rate of change should still be within the ranges stated above.

Figure 9:
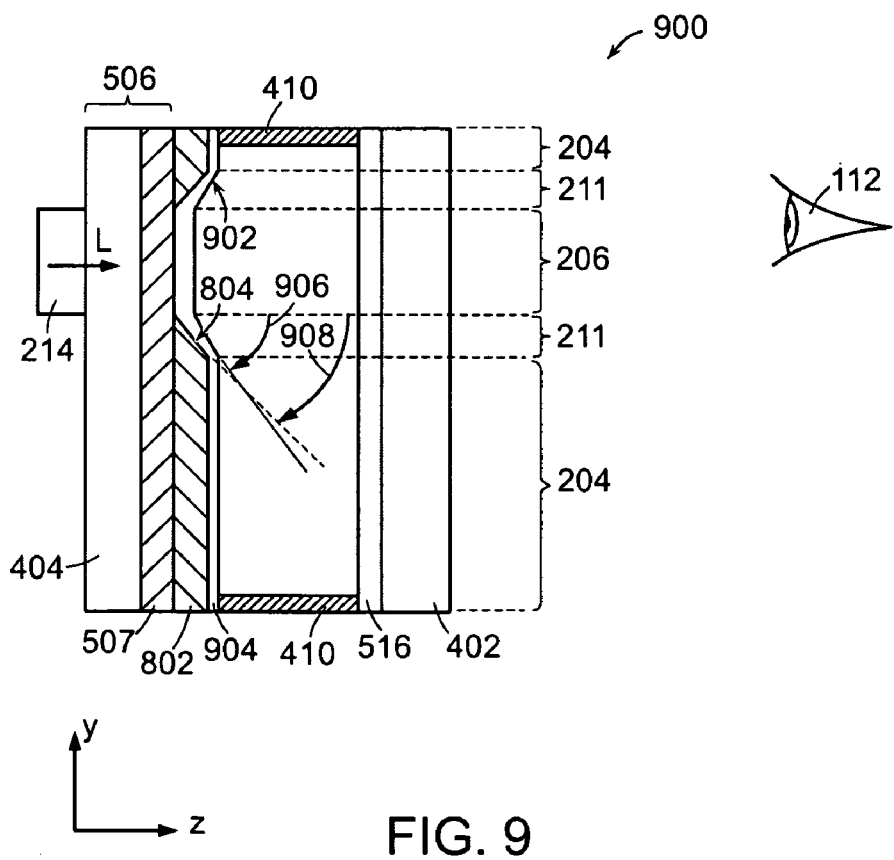
FIG. 9 shows a cross-sectional view of another embodiment of an electrochromic mirror assembly including a mirror element having a graded transition between the opaque and display areas of the mirror element.

An alternative embodiment of the invention provides a modification to one of the gradient opacifier designs described above and allows the user to choose the reflectance value of the opaque regions of the mirror element independently from the reflectance of the transflective region of the mirror element. In the previous example, when the relatively constant thickness upper reflector layer is increased or decreased to adjust the reflectance in either the transflective or opaque zone then the reflectance will change in the other area. The amount of change in either area will be a function of the specific layers in that area but since the thickness of the reflector is constant in the two areas one cannot independently adjust the reflectance in each zone. According to this alternative embodiment, the thickness of the top reflective layer is graded counter to that of the opacifying layer. The embodiment 900, as shown in FIG. 9, is referred to hereinafter as a double gradient design. A double gradient design of a multi-zone mirror element manifests in a transition region (bridging the opaque and transflective areas) that is defined by (i) a graded opacifying layer with thickness that increases in a direction away from the transflective area and (ii) a continuous reflecting layer that substantially completely covers both the opacifying layer and the transflective area and that has thickness decreasing in the transition region in the same direction as that defined above. To provide for such geometry, an upper surface 902 of a reflecting layer 904 (made of, e.g., silver alloy) that is not in physical contact with the underlying opacifying layer 802 may have a portion that is inclined with respect to the third surface of the embodiment to define thickness of the reflecting layer 904 that decreases, with displacement from the transflective zone in a direction to the opaque zone of the reflector. The angles at which a portion of the surface 804 of the opacifying layer and a portion of the upper surface 902 of the continuous reflecting layer 904 are sloped with respect to the third surface of the embodiment, may be different. In such a case, the first rate (at which the thickness of the opacifying layer increases with displacement from the transflective area in a first direction towards the opaque area) and the second rate (at which the thickness of the reflecting overlayer 904 decreases in a second direction from the transflective area towards the opaque area) are generally different. In a specific embodiment, however, the first and the second rates may be equal.

As discussed above in reference to FIG. 8, in the gradient opacifier design the reflectance value increases from the transflective region through the transition region towards the fully opaque region by an amount essentially dictated by the choice of opacifying material. In comparison, in the double gradient design of embodiment 900 of FIG. 9, the top reflecting layer 904 is varied at the second rate in order to at least reduce the rate of reflectance increase (in the transition region) contributed by the change of thickness of the opacifying layer 802. As a consequence of such variation, the top reflector layer 904 is thicker in the transflective area 206 than in the opaque area 204. The following examples demonstrate some alternative embodiments of a double gradient design of the invention and detail how the reflectance difference between the two areas can be reduced. A skilled artisan will also appreciate that the same teachings can be applied to increase the reflectance difference between the two areas if that effect is required for a given application.

Example 6

In a specific embodiment of the third surface thin-film coating stack may be built according to the structure depicted in FIG. 9, where a base bi-layer 507 may include, in the order of deposition on the 1.6 mm thick glass substrate 404, a 50 nm thick layer of $TiO_2$ and a 21 nm thick layer of ITO. The opacifying layer 802 may be made of Molybdenum and its full thickness of 30 nm in the opaque area of the multi-zone reflector 910 may be tailored to approximately zero at the edge of the transflective zone 206. The opacifying layer is overcoated with an uninterrupted silver alloy layer 904, which has a thickness of 11.3 nm in the opaque area and a thickness of 17.3 nm within the transflective area. The rest of the parameters are the same as in Example 5. As a result, the opacifying layer 802, disposed on the supporting base 506 outside of the transflective zone 206, has a lower surface facing the supporting base 506 and the upper surface. The opacifying layer 802 also has thickness that increases, with displacement from a transflective zone 206 in a direction to the opaque zone 204, at a first rate. The continuous reflecting layer 904 substantially completely covers the upper surface of both the opacifying layer 802 and the transflective zone 206. The layer 904 has thickness that decreases, with displacement from the transflective zone in a direction to the opaque zone of the reflector, at a second rate. The optical characteristics of the opaque and transflective areas of the present embodiment are summarized in Table 9. It can be seen that due to a counter-grading of the top reflecting layer 904 with respect to the underlying opacifying layer 802, the difference in reflectance values between the opaque and transflective areas has been reduced from 17.1 percent in the embodiment of Example 5 to only about 10 percent in the current embodiment. The control of the grading of the reflecting layer 904 in the transition region 211 allows the reflectance values in each of the regions to be independently set to meet the design goals. In a specific embodiment, additional layers (not shown), e.g. an additional reflecting layer, may be interposed between the base layer 507 and the opacifying layer 507 to tailor optical characteristics of the mirror.

TABLE 9

| | Transmittance, % | Reflectance, % | a* (in reflection) | b* (in reflection) |
|---|---|---|---|---|
| Opaque Area, 104 | 0.4 | 65.0 | −2.2 | 4.8 |
| Transflective Area, 106 | 33.0 | 55.2 | −3.3 | 3.1 |

Generally, as discussed earlier, the increase of reflectance in the transflective area of the mirror element reduces the throughput of light L from the display 214 towards the user 112. As demonstrated by the data in Table 10, the contrast of the display on the background of the ambient light I reflected in the mirror rises rapidly as the reflectance of the transflective area of the mirror decreases. In reference to FIG. 1, the data are provided for an arbitrary material system having an overall constant 10 percent absorption (A=0.1) in the reflector stack, an assumed 4,000 $cd/m^2$ raw display signal luminance, and an assumed 1,000 $cd/m^2$ ambient light luminance. Although the maximum light transmission through the transflective area that may be tolerated varies, depending on particular components behind the mirror and illuminating condition, an approximate practical upper limit may be suggested to be about 40 to 50 percent. In our experience, as transmittance of the transflective area of the multi-zone mirror that is not operating in direct sunlight is approaching 40 percent, the display components behind the mirror may become visible to the viewer. In other applications, depending on lighting conditions and the properties of the components behind the mirror, higher or lower transmittance values may be viable and preferable. Embodiments of the present invention, used in mirror assemblies including a display device, may provide for the display-signal contrast that is greater than 1, preferably greater than 2, more preferably greater than 3, and most preferably greater than 4. Embodiments of the present invention may also provide for a multi-zone reflector having a transflective area with transmittance of less than about 70 percent, preferably less than about 55 percent, and more preferably less than about 40 percent.

TABLE 10

| % T | % R | Intensity of signal from display | Intensity of reflected ambient light | Contrast Ratio |
|---|---|---|---|---|
| 10 | 80 | 400 | 800 | 0.5 |
| 20 | 70 | 800 | 700 | 1.1 |
| 30 | 60 | 1200 | 600 | 2.0 |
| 40 | 50 | 1600 | 500 | 3.2 |
| 50 | 40 | 2000 | 400 | 5.0 |
| 60 | 30 | 2400 | 300 | 8.0 |
| 70 | 20 | 2800 | 200 | 14.0 |

Another practical limitation in implementing the embodiments discussed above in the context of EC-mirrors is material compatibility and durability. In particular, chemical content of electrochromic medium (ECM) imposes limitations on which materials can be used in contact with the ECM and how such materials can be used. It shall be appreciated that durability of certain materials (such as silver or silver alloys) used for fabrication of some reflecting layers in the embodiments of the thin-film stack of the invention may be increased or decreased when additional underlayers or overlayers, made of specific materials, are used in direct contact with silver or silver alloy. For example, the layer stack demonstrated in Example 1 is a split reflector design utilizing silver alloy reflecting layers and a Chromium opacifying layer in direct contact with silver alloy. From the practical standpoint, as we empirically found, Chromium does not provide the optimal underlayer for thin silver or silver alloy layers. While the embodiment disclosed in Example 1 yields a functional and aesthetically acceptable mirror element, it has limited durability. Specifically, the silver deposited on Chromium is prone to migration along the surface of and aggregation into clusters on the surface of the chromium underlayer during high temperature storage and/or long term repeated cycling of the mirror element. The migration and aggregation of silver molecules results in a hazy appearance of some portions of the mirror element.

Another alternative embodiment of the invention takes advantage of the various designs described in this disclosure and in Our Prior Applications. In particular, the concept of a split reflector design can be combined with the concept of a gradient opacifier to yield the embodiment illustrated in FIG. 10. Hereinafter, such combined design is referred to as split gradient reflector design. As shown, the embodiment 1000 includes the "split" reflective layers 1010 and 1020 and the graded opacifying layer 1030 disposed outside of the transflective area between the split layers 1010 and 1020. Such combination allows the user, on one hand, to decouple the reflectance of the opaque area from that of the transflective area, making these reflectance characteristics independent from one another and, on the other hand, to retain the transition region that reduces the visual mismatch between the opaque and transflective areas that such region bridges. The relative reflectance difference between the areas can be adjusted within the limits of the materials used in fabrication.

Figure 10:
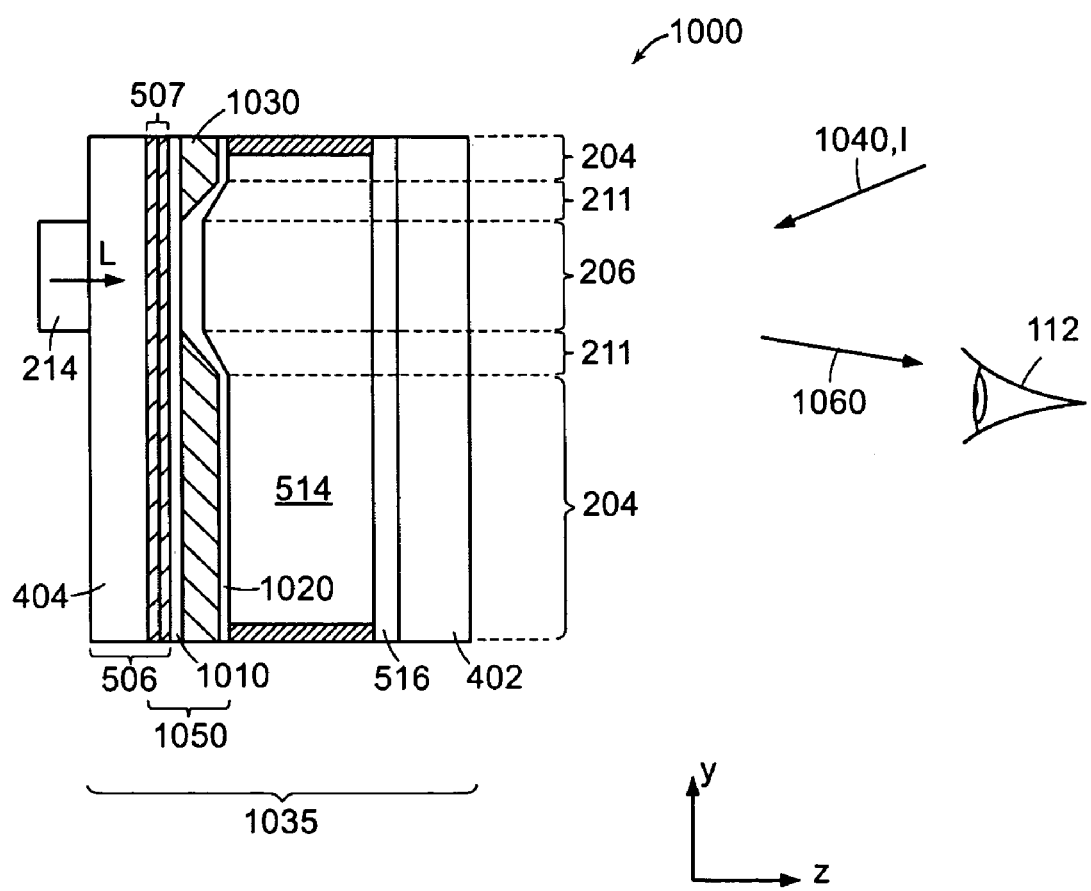
FIG. 10 shows a cross-sectional view of yet another embodiment of an electrochromic mirror assembly where a mirror element is characterized by a graded transition between the opaque and display areas of the mirror element.

In the specific embodiment 1000, the base bi-layer 507 is made of 50 nm of $TiO_2$ and 21 nm of ITO, deposited in that order on the third surface of the 1.6 mm thick glass plate 404. Adjacent the base bi-layer 507, the lower reflecting layer 1010 of silver alloy (11.3 nm) is disposed, followed by a graded opacifying layer 1030 of Ruthenium (30 nm in the opaque region 204 tailored down to zero thickness at the edge of the transflective area 106), and an uninterrupted upper reflecting layer 1020 of silver alloy (6.0 nm) extending over both the opaque and transflective areas. Such thin-film stack has optical characteristics summarized in Table 11. Comparing these values to those for the graded opacifier example utilizing Ruthenium (from Table 1), it can be observed that, due to the use of the gradient split reflector design instead of the gradient opacifier design, the reflectance values of the opaque and the transflective areas are decoupled from one another and it becomes possible to design a mirror element with lower reflectance in the opaque area. Examples of such design have been provided in Our Prior Applications (see, e.g., Example 8 of U.S. 2008/0310005). The described gradient split reflector embodiment also exhibits the preferred trait of having relatively constant and uniform color distribution in both opaque and transflective areas of the mirror and across the transition region. The reflectance and color distribution as functions of the thickness of the opacifying layer 1030 in the embodiment 100 of FIG. 10 is shown for various opacifying layer materials in FIGS. 11 and 12.

TABLE 11

| | Transmittance, % | Reflectance, % | a* (in reflection) | b* (in reflection) |
|---|---|---|---|---|
| Opaque Area, 104 | 0.4 | 65.0 | −2.9 | 3.2 |
| Transflective Area, 106 | 33.0 | 55.2 | −3.3 | 3.1 |

In the discussion of the split silver stack design it was pointed out that structural stability of thin layers of silver alloy on top of Chromium is not always optimal. This factor imposes a practical limitation also on the gradient split silver design embodied in Example 8. Other metals used instead of Chromium (such as those listed in Table 8) in opacifying layers may produce more stable layer stacks in contact with silver alloy. The affinity of different thin-film materials may be increased by employing surface treatments taught in U.S. patent applications from which priority of the current application is being claimed. For example, a treatment of a surface of a Chromium layer with sulfur improves the adhesion among the thin-films.

Color Excursion.

As known in the art, two parallel reflecting surfaces (e.g., formed by parallel reflecting layers of silver) positioned at a distance from one another form a basic Fabry-Perot etalon. The high reflectance of the two silver interfaces on the dielectric layer significantly enhances the color tuning strength of the layer. Similarly, a Fabry-Perot etalon is also formed by filling the thin gap between the two parallel silver metallic layers (such as silver or silver alloy layers) with metal. Interference effects in such structure can sometimes be observed due to the large mismatch of refractive indices and extinction coefficients (n and k, respectively) between silver and most metals. In further reference to the specific embodiment of a gradient split reflector design discussed in reference to FIG. 10, light propagating through the thin-film stack interferes differently in the opaque area 204 of the EC-mirror 1035 and at various positions across the transition area 211 where the opaque layer has non-uniform thickness. Such non-uniform interference produces a visible change in color across the transition region. In particular, the ambient light 1040 incident onto the third surface stack 1050 through the front lite of glass 402 and the ECM, interferes with itself in a Fabry-Perot etalon formed, in the opaque area 104, by the reflecting silver alloy layers 1010 and 1020 and the Ruthenium opacifying layer 1030. As a result of such interference, the b* value of ambient light 1060 reflected by the opaque area 204 may "drift" to more positive values as the thickness of the opacifier 1030 is reduced in a graded area. As a result, a yellowish band can be observed in reflection in the transition region 211 of the mirror 1035. Other color bands may form depending on the optical constants of the materials used in a particular embodiment. This color excursion effect varies in strength depending on the optical constants of the material chosen for the opacifying layer. An additional effect of light interference as described is a significant reduction of reflectance in the same thickness region of the gradient. Although the embodiments discussed above utilized metals or metallic alloys as opacifying materials, other materials such as semimetals (such as bismuth), metalloids, dielectrics, or semiconductors may be generally used in place of metals or alloys, provided they possess material properties that assure the needed level opacification in a given design.

Referring once again to FIGS. 11 and 12, FIG. 11 demonstrates the reflectance value of the third surface reflector stack 1050 of the embodiment 1000 of FIG. 10 as a function of thickness of the opacifying layer 1030. The data are presented for several opacifying materials including Ruthenium, Chromium, Rhenium, and Molybdenum. From FIG. 11 one can infer the spatial change in reflectance of the stack 1030 in the transition region of the mirror element, defined by the graded portion of the opacifying layer 1030. The corresponding change in the color, observed by the viewer 112 in reflection from the embodiment 1000, is presented in FIG. 12 as a variation of the color coordinate b* with respect to the thickness of the opacifying layer 1030. As can be seen from the data, the gradient split reflector embodiment utilizing Chromuim-based opacifying layer has superior optical characteristics compared to those utilizing other materials. The data demonstrate a generally monotonically changing values of both the reflectance and color across the transition region of the mirror corresponding to the graded portion of the opacifying layer 1030.

Example 7

Figure 11:
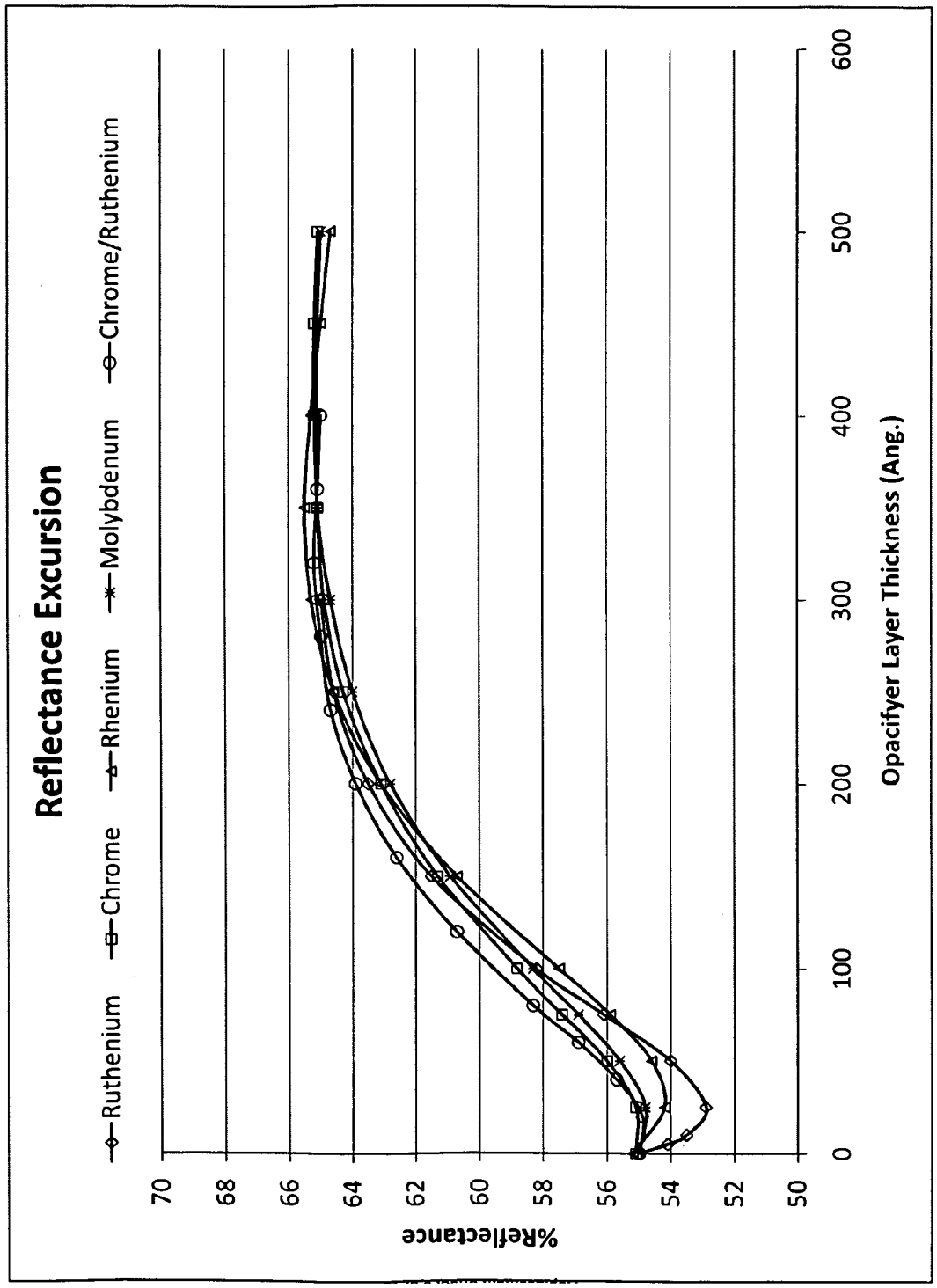
FIG. 11 is a graph showing the reflectance excursion as a function of thickness of an opacifying layer in the embodiments of FIGS. 10 and 13. Different curves correspond to opacifying layers made of different materials.
Figure 12:
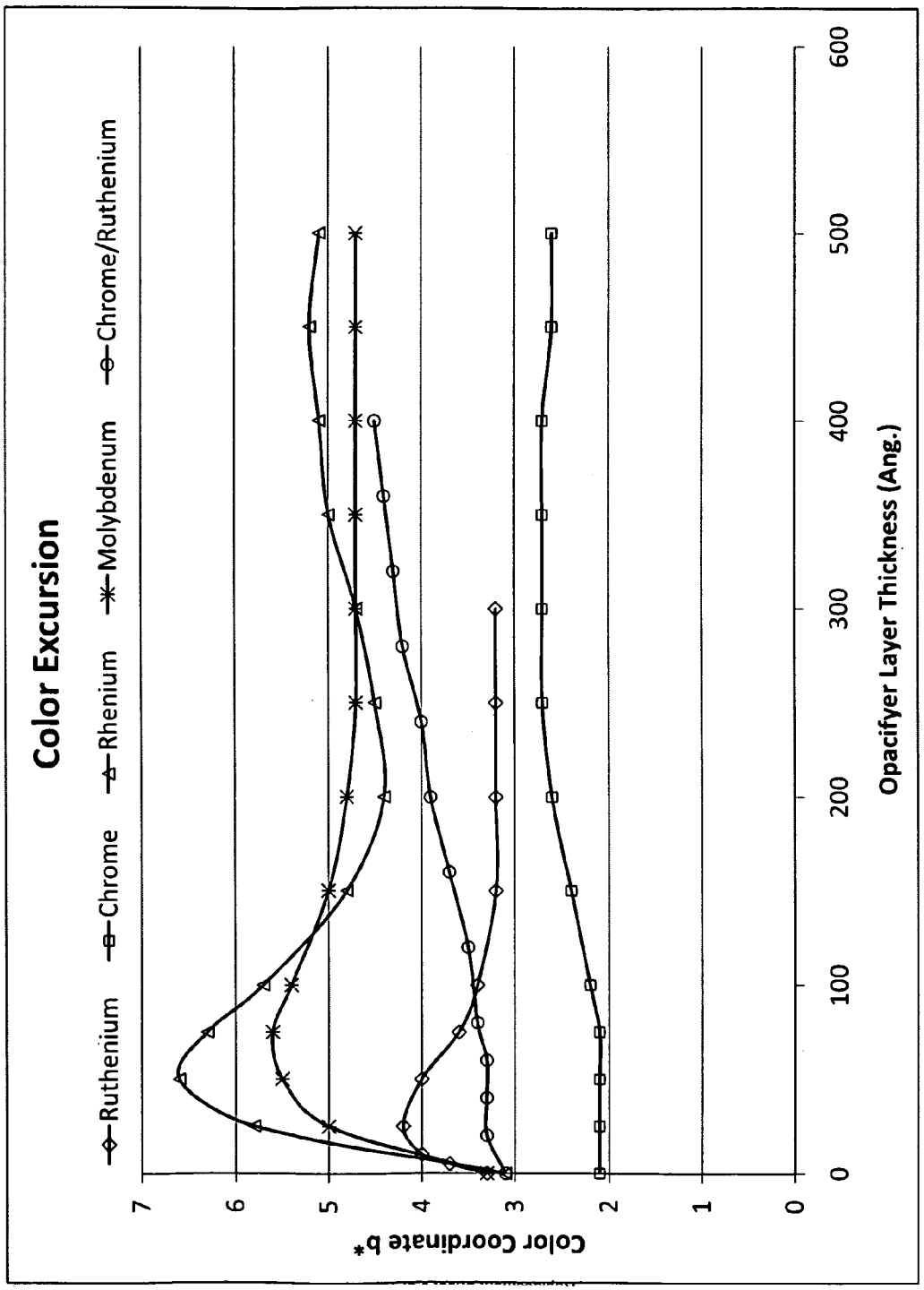
FIG. 12 is a graph showing the color excursion as a function of thickness of an opacifying layer in the embodiments of FIGS. 10 and 13. Different curves correspond to opacifying layers made of different materials.
Figure 13:
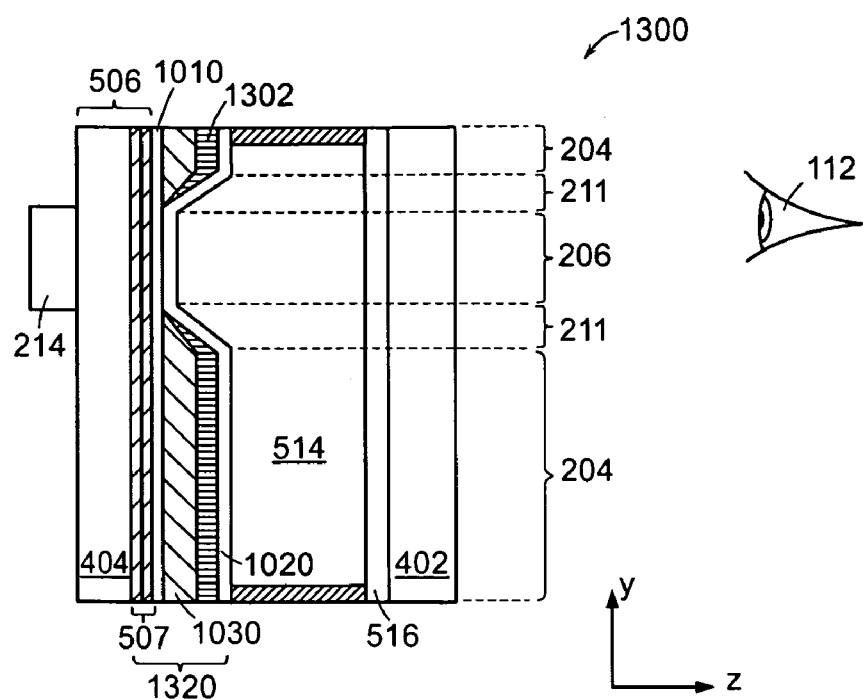
FIG. 13 shows a cross-sectional view of an alternative embodiment of an electrochromic mirror including a mirror element that has a graded transition between the opaque and display areas of the mirror element.

An alternative embodiment 1300 of the present invention is shown in FIG. 13, and the reflectance and color data in FIGS. 11 and 12, corresponding to this embodiment, are labeled "Chrome/Ruthenium". As compared to the embodiment 1000 of FIG. 10, the present embodiment 1300 has an additional flash graded opacifying layer 1302 of Ruthenium disposed on the upper surface of the Chromium opacifying layer 1030 prior to the deposition of the top reflecting layer 1020. In general, the geometry of the additional flash graded opacifying layer 1302 follows that of the layer 1030. In particular, the flash layer 1302 has its thickness gradually reduced, in the transition region 211 between the opaque and transflective areas 204 and 206, from the full value of 5.0 nm down to zero at the edge of the transflective area 206. The layer 1302 is substantially spatially coextensive with the layer 1030 in that both the layer 1030 and the layer 1302 are projected onto the substantially the same portion of the third surface of the embodiment 1300. In this case, bounds of both layers 1030 and 1302 identify substantially the same transflective area 206. (In a specific embodiment, however, the layer 1302 may be deposited slightly beyond the extent of the layer 1030 (not shown) into the transflective area 206 of the embodiment 1300.) The thick (40.0 nm) graded Chromium opacifying layer 1030 serves to reduce most of the transmittance in the opaque area 204. The thin, flash graded opacifying layer 1302 of Ruthenium reduces the transmittance further and, in combination with Chromium layer 1030, advantageously compensates the yellow color excursion, in the graded transition region, otherwise attributable to the presence of a single-metal opacifying layer and discussed above. Yet another advantage of adding the flash graded layer 1302 of Ruthenium to the graded opacifying layer 1030 of Chromium is significant improvement in mechanical stability of the thin (10.5. nm) top reflecting layer 1020 of silver alloy, which is now in physical contact with Ruthenium and not Chromium. As shown, both the Chromium layer 1030 and the Ruthenium flash layer 1302 are graded at the same rate, each layer reaching both its full and minimum thicknesses at substantially the same spatial positions. However, the layers 1030 and 1302 may be generally graded at different rates. Moreover, in order to assure that direct contact between the silver alloy layer 1020 with the Chromium layer 1030 is minimized, in a specific embodiment the gradually thinned Ruthenium layer 1302 can be extended (not shown) into the transflective area 206 beyond the limit of the Chromium layer 1030. Other material parameters characterizing the embodiment 1300 are as follows: the base bi-layer 507 includes a 50 nm layer of $TiO_2$ and a 21 nm layer of ITO, deposited in that order on the third surface of the embodiment (i.e., the front surface of the glass substrate 404); the lower reflecting layer 1010 is a 6.7. nm layer of silver alloy; the ECM 514 is 135 micron thick; a 145 nm thick layer 516 of ITO is deposited on the second surface (the rare surface of 1.6 mm thick front glass substrate 402). The optical characteristics of the opaque and the transflective areas, 404 and 406, are summarized in Table 12.

TABLE 12

| | Transmittance, % | Reflectance, % | a* (in reflection) | b* (in reflection) |
|---|---|---|---|---|
| Opaque Area, 104 | 0.3 | 65.0 | −2.8 | 4.5 |
| Transflective Area, 106 | 33.2 | 55.0 | −3.3 | 3.1 |

Example 8

Yet another alternative embodiment of the invention provides further advantages in operation of the multi-zone mirror. In particular, the idea of a split reflector design having an abrupt transition between the opaque and transflective areas of the mirror may be advantageously implemented together with the idea of a gradient split reflector design to yield an alternative embodiment 1400 of FIG. 14. As shown, the continuous upper and lower reflecting silver alloy layers 1010 and 1402, are separated by an opacifying bi-layer 1404 combining a graded opacifying layer 1030 of Chromium and an abruptly-edged Ruthenium flash opacifying layer 1406. Spatial limits defined by the lateral extent of the layer 1030 in the plane parallel to the third surface of the embodiment 1400 determined a lateral bound of the layer 1030. The lateral bound of the layer 1030 defines an opening through the layer 1030. The lateral bound of the layer 1402 defines an opening through the layer 1402 that, as shown, extends through the opening in the opacifying layer 1030. As shown, the layer 1406 extends beyond the lateral bound of the layer 1030. The upper and lower reflecting layers 1010 and 1402 are substantially spatially coextensive in that they substantially completely cover the opaque and transflective areas of the embodiment 1400. As shown, the abruptly-edged Ruthenium flash layer 1406 has a constant thickness. The flash layer 1406 extends from the opaque area 104 towards the transflective area 106 beyond the graded portion of the layer 1030. Such layer extension creates a "lip" 1408. In this embodiment, the transflective area 206 of the mirror element extends across the portion of the coating defined by the "lip" 1408. The thick graded Chromium layer 1030 enables a gradual change of reflectance from the maximum value of 65.3% in the opaque region 204 to 55.1% in the transflective area 206, and the gradual change in transmittance from 0.2 percent to 33 percent, respectively. This change occurs over a graded-transition distance that is large enough to maintain a stealthy appearance of the mirror element. The abruptly-edged flash opacifying layer 1406 allows the user to obtain a lower value of transmittance, 25 percent, in the area of the "lip" 1408 of the coating stack 1410, thus further facilitating the stealthy appearance of the mirror and making it easier to hide the components that may be positioned adjacent to the display or components behind the mirror. In particular, the use of layer 1406 serves the purpose of reducing the transmittance of the transflective area 206 without significantly changing the overall reflectance of the mirror. The thickness of Ruthenium layer 1406 in this example was chosen to provide an 8 percent change in transmittance between the transflective area 106 and the area of the "lip" 1408. Various parameters of the embodiment 1400 are listed below:

Thickness of the front and rear glass substrates 402 and 404: 1.6 mm;

Base bi-layer 507 includes a 48 nm layer of $TiO_2$ deposited on the third surface of the embodiment and overcoated with a 18 nm layer of ITO. Together, an underlying second light of glass 404 and the base bi-layer 507 form a base 506 supporting the stack 1410.

Thicknesses of reflecting silver alloy layers 1010 and 1402: 8.3 nm and 10 nm, respectively;

Maximum thickness of Chromium opacifying layer 1030: 50 nm;

Thickness of flash opacifying layer 1406 of Ruthenium: 1.3. nm;

Thickness of the ECM 414: approximately 135 micron;

Thickness of the ITO layer 416 on the second surface of the embodiment: 145 nm.

The optical characteristics of the described embodiment are summarized in Table 11a. It should be noted that thickness of the layer 1406 may be adjusted as required to tune the change transmittance change if larger or smaller differences in transmittance are required, depending on the application. The Ruthenium flash opacifying layer 1406 provides an additional benefit of enhancing the stability of the silver alloy layer 1402, thus improving the mechanical and optical properties of the stack 1410.

TABLE 11a

|  | Transmittance, % | Reflectance, % | a* (in reflection) | b* (in reflection) |
| --- | --- | --- | --- | --- |
| Opaque Area, 104 | 0.2 | 65.3 | −3.2 | 2.9 |
| "Lip" Area, 1408 | 25.5 | 55.3 | −3.2 | 2.7 |
| Transflective Area, 106 | 33 | 55.1 | −2.8 | 2.1 |

Certain variations of embodiments discussed above may be introduced within the scope of the invention in order to tailor desired optical and/or mechanical performance of the resulting mirror element. For example, although the opacifying layers of the embodiment 1400 were described with respect to Chromium and Ruthenium, other materials may be used depending on the needs of a given application. In general, the slope of an upper surface of a particular graded thin-film layer, defined with respect to the surface of the underlying supporting base, and point of termination of the slope between the transflective and opaque regions may be varied. For example, a precise margin of a layer such as layer 1302 (graded edge) of the embodiment 1300 or position of abrupt edges of layers 1406 and 1402 of the embodiment 1400 may be generally varied. In particular, the Ruthenium flash opacifying layer 1302 may extended slightly beyond the extent of the Chromium opacifying layer 1030 to assure that the layers 1030 and 1020 and not in direct contact, to assure proper adhesion of the silver alloy layer within the thin-film stack 1310. The spatial distribution of thickness of a particular layer may also be generally varied, as discussed below.

Figure 15A:
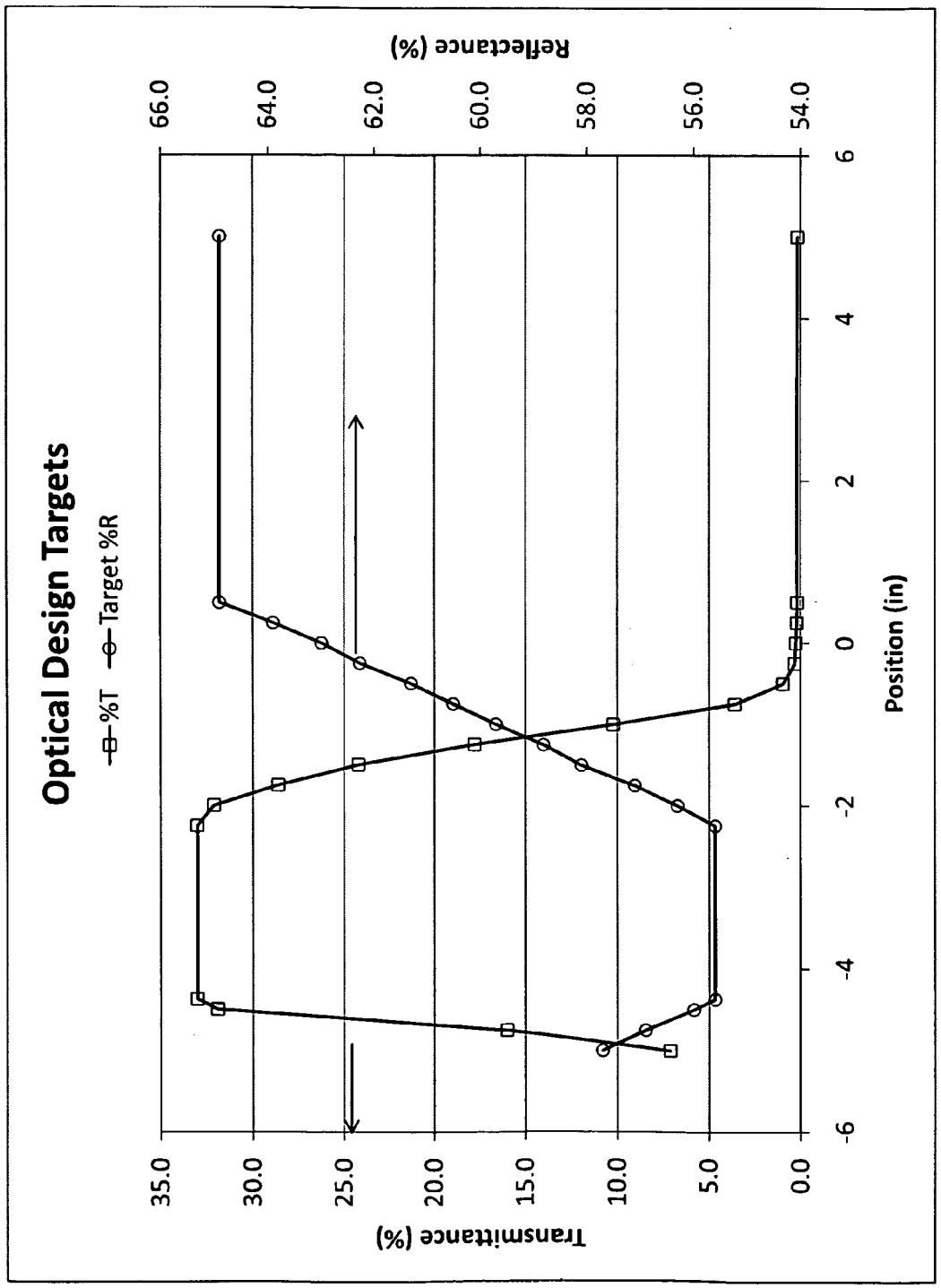
FIG. 15 illustrates parameters of alternative embodiments of the invention. (A): target optical characteristics; (B) spatial change in thicknesses of metallic layers used in a third-surface thin-film stack of an embodiment having optical characteristics of FIG. 15(A); (C) target optical characteristics of yet another alternative embodiment of the invention.
Figure 15B:
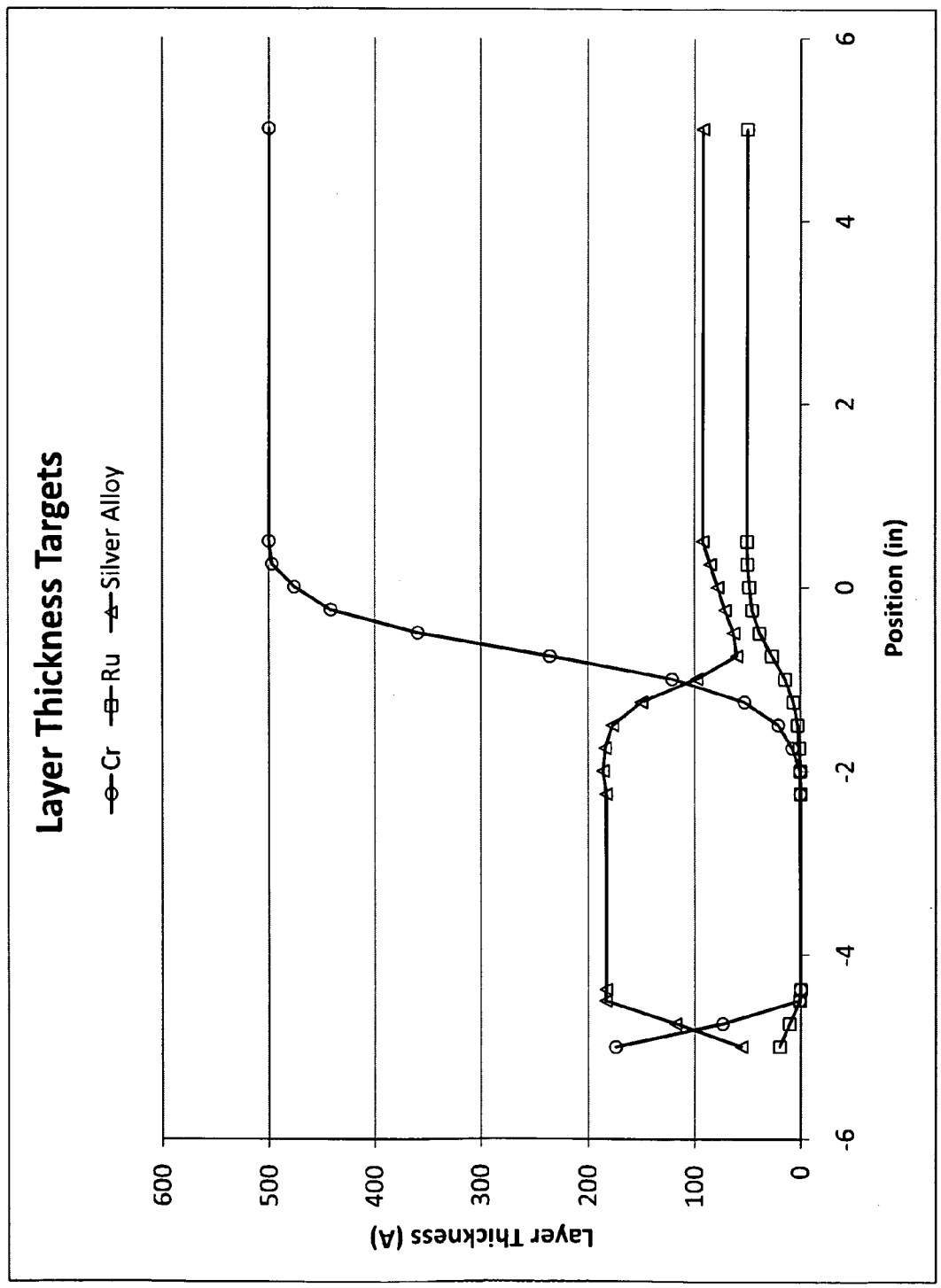

For example, a specific embodiment of a multi-zone mirror element may be structured in a fashion similar to that of the embodiment 1300 of FIG. 13, but with the upper reflecting layer 1020 the thickness of which is not substantially uniform but rather slightly variable. In the following description, therefore, a reference is made to elements of the general thin-film structure of the embodiment 1300, and the differences in thin-film structure are emphasized. FIG. 15(A) illustrates target optical characteristics of the present specific embodiment, which includes a five-layer thin-film stack fabricated on the third surface. The properties of the stack are summarized in Table 12a as a function of a one-dimensional position (corresponding to the y-axis of FIG. 13) along the third surface of the EC-mirror. FIG. 15(B) shows corresponding changes in thickness of three metallic layers used in this embodiment with position across the third surface: a layer of Chromium, 1030, a layer of Ruthenium, 1302, and a layer of silver alloy, 1302. The essentially opaque area can be seen to extend approximately between the positions identified as −0.75 in and 5 in across the substrate. The transflective display area, extending approximately between the positions of −5 in and 1.75 in, utilizes only three of the five layers listed in Table 12. In this embodiment, the graded Chromium opacifying layer 1030, deposited on the supporting base that included a glass substrate and a base bi-layer of $TiO_2$ and ITO, asymptotically extends into the transflective display area. A flash opacifying layer 1302 of Ruthenium, deposited above the Chromium layer 1030, extends asymptotically into the transflective display area beyond the extent of the Chromium layer 1030. The fairly complicated thickness profile of an upper continuous reflecting layer 1020 of silver alloy assures a substantially linear change in reflectance between the opaque and display areas.

Figure 15C:
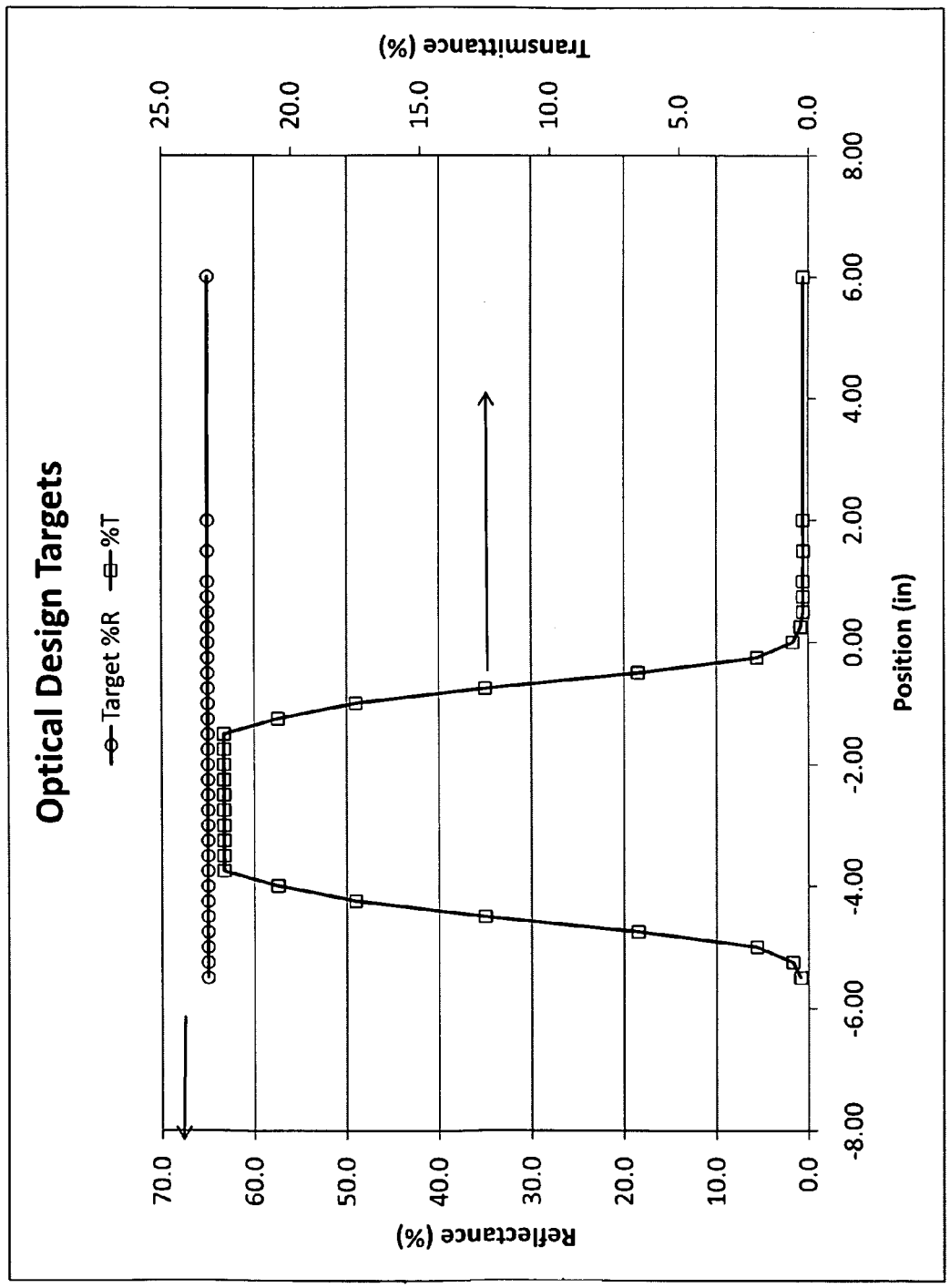

Yet another alternative embodiment represents a modification of the embodiment 1300 of FIG. 13. By employing a non-uniform reflective layer 1020, this embodiment may generally achieve a uniform reflectance in excess of at least 50 percent across the surface of the mirror element and a transmittance levels below approximately 5 percent in the opaque area and below approximately 50 percent in the transflective area. In a specific embodiment, a uniform reflectance of about 65 percent across the surface of the mirror element may be achieved, while simultaneously keeping transmittance level well below 0.5 percent in the opaque area and above 20 percent in the transflective area. The optical properties of this specific embodiment are illustrated in FIG. 15(C), and corresponding geometry of thin-film layers comprising a thin-film stack that may be deposited on the third surface to achieve such properties is described in Table 13.

TABLE 12a

| Position across substrate (in) | Glass Thickness (mm) | TiO$_2$ (Å) | ITO (Å) | Cr (Å) | Ru (Å) | Silver Alloy (Å) | % T | % R |
|---|---|---|---|---|---|---|---|---|
| −5 | 1.6 | 480 | 180 | 174 | 19.7 | 55.8 | 7.1 | 57.7 |
| −4.75 | 1.6 | 480 | 180 | 73.4 | 10.4 | 118 | 16.0 | 56.9 |
| −4.5 | 1.6 | 480 | 180 | 1.18 | 0.72 | 184 | 31.9 | 56 |
| −4.375 | 1.6 | 480 | 180 | 0 | 0 | 183 | 33.0 | 55.6 |
| −2.25 | 1.6 | 480 | 180 | 0.07 | 0.01 | 183 | 33.0 | 55.6 |
| −2 | 1.6 | 480 | 180 | 0.33 | 0.08 | 186 | 32.1 | 56.3 |
| −1.75 | 1.6 | 480 | 180 | 7.9 | 1.1 | 181 | 29.1 | 57.1 |
| −1.5 | 1.6 | 480 | 180 | 21.1 | 2.6 | 177 | 24.2 | 58.1 |
| −1.25 | 1.6 | 480 | 180 | 52.8 | 6.6 | 150 | 17.8 | 58.8 |
| −1 | 1.6 | 480 | 180 | 121 | 14.5 | 98 | 10.2 | 59.7 |
| −0.75 | 1.6 | 480 | 180 | 235 | 26.8 | 60 | 3.6 | 60.5 |
| −0.5 | 1.6 | 480 | 180 | 359 | 38.4 | 63 | 0.95 | 61.3 |
| −0.25 | 1.6 | 480 | 180 | 442 | 45.4 | 71 | 0.31 | 62.3 |
| 0 | 1.6 | 480 | 180 | 476 | 48.1 | 78 | 0.25 | 63.0 |
| 0.25 | 1.6 | 480 | 180 | 497 | 49.8 | 85 | 0.20 | 63.9 |
| 0.5 | 1.6 | 480 | 180 | 500 | 49.9 | 92 | 0.18 | 64.9 |
| 5 | 1.6 | 480 | 180 | 500 | 50 | 92 | 0.18 | 64.9 |

TABLE 13

| Position across substrate (in) | Glass Thickness (mm) | TiO$_2$ (Å) | ITO (Å) | Cr (Å) | Ru (Å) | Silver Alloy (Å) | % T | % R |
|---|---|---|---|---|---|---|---|---|
| −5.50 | 1.6 | 480 | 180 | 454 | 46.5 | 92.2 | 0.3 | 65.0 |
| −5.25 | 1.6 | 480 | 180 | 387 | 40.9 | 90.9 | 0.6 | 65.0 |
| −5.00 | 1.6 | 480 | 180 | 273 | 30.6 | 90 | 2.0 | 65.0 |
| −4.75 | 1.6 | 480 | 180 | 149 | 17.8 | 119 | 6.6 | 65.0 |
| −4.50 | 1.6 | 480 | 180 | 66.5 | 8.3 | 177 | 12.5 | 65.0 |
| −4.25 | 1.6 | 480 | 180 | 26.2 | 3.3 | 213 | 17.5 | 65.0 |
| −4.00 | 1.6 | 480 | 180 | 10.0 | 1.4 | 227 | 20.5 | 65.0 |
| −3.75 | 1.6 | 480 | 180 | 1.1 | 0.4 | 234 | 22.6 | 65.0 |
| −3.50 | 1.6 | 480 | 180 | 0 | 0 | 234 | 22.6 | 65 |
| −3.25 | 1.6 | 480 | 180 | 0 | 0 | 234 | 22.6 | 65 |
| −3.00 | 1.6 | 480 | 180 | 0 | 0 | 234 | 22.6 | 65 |
| −2.75 | 1.6 | 480 | 180 | 0 | 0 | 234 | 22.6 | 65 |
| −2.50 | 1.6 | 480 | 180 | 0 | 0 | 234 | 22.6 | 65 |
| −2.25 | 1.6 | 480 | 180 | 0 | 0 | 234 | 22.6 | 65 |
| −2.00 | 1.6 | 480 | 180 | 0 | 0 | 234 | 22.6 | 65 |
| −1.75 | 1.6 | 480 | 180 | 0 | 0 | 234 | 22.6 | 65 |
| −1.50 | 1.6 | 480 | 180 | 1.1 | 0.4 | 234 | 22.6 | 65.0 |
| −1.25 | 1.6 | 480 | 180 | 10.0 | 1.4 | 227 | 20.5 | 65.0 |
| −1.00 | 1.6 | 480 | 180 | 26.2 | 3.3 | 213 | 17.5 | 65.0 |
| −0.75 | 1.6 | 480 | 180 | 66.5 | 8.3 | 177 | 12.5 | 65.0 |
| −0.50 | 1.6 | 480 | 180 | 149 | 17.8 | 119 | 6.6 | 65.0 |
| −0.25 | 1.6 | 480 | 180 | 273 | 30.6 | 90 | 2.0 | 65.0 |
| 0.00 | 1.6 | 480 | 180 | 387 | 40.9 | 90.9 | 0.6 | 65.0 |
| 0.25 | 1.6 | 480 | 180 | 454 | 46.5 | 92.2 | 0.3 | 65.0 |
| 0.50 | 1.6 | 480 | 180 | 480 | 48.5 | 92.6 | 0.2 | 65.0 |
| 0.75 | 1.6 | 480 | 180 | 496 | 49.8 | 92.7 | 0.2 | 65.0 |
| 1.00 | 1.6 | 480 | 180 | 497 | 49.7 | 92.8 | 0.2 | 65.0 |
| 1.50 | 1.6 | 480 | 180 | 494 | 49.4 | 92.7 | 0.2 | 65.0 |
| 2.00 | 1.6 | 480 | 180 | 488 | 48.8 | 92.7 | 0.2 | 65.0 |
| 6.00 | 1.6 | 480 | 180 | 488 | 48.8 | 92.7 | 0.2 | 65.0 |

Figure 16:
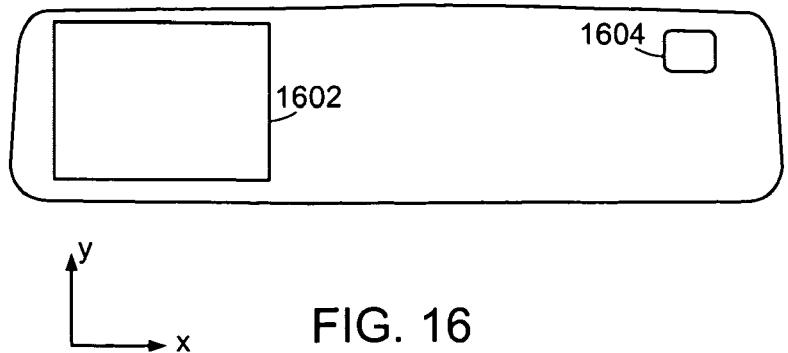
FIG. 16 is a schematic front elevated view of a mirror assembly constructed in accordance with the present invention.
Figure 17:
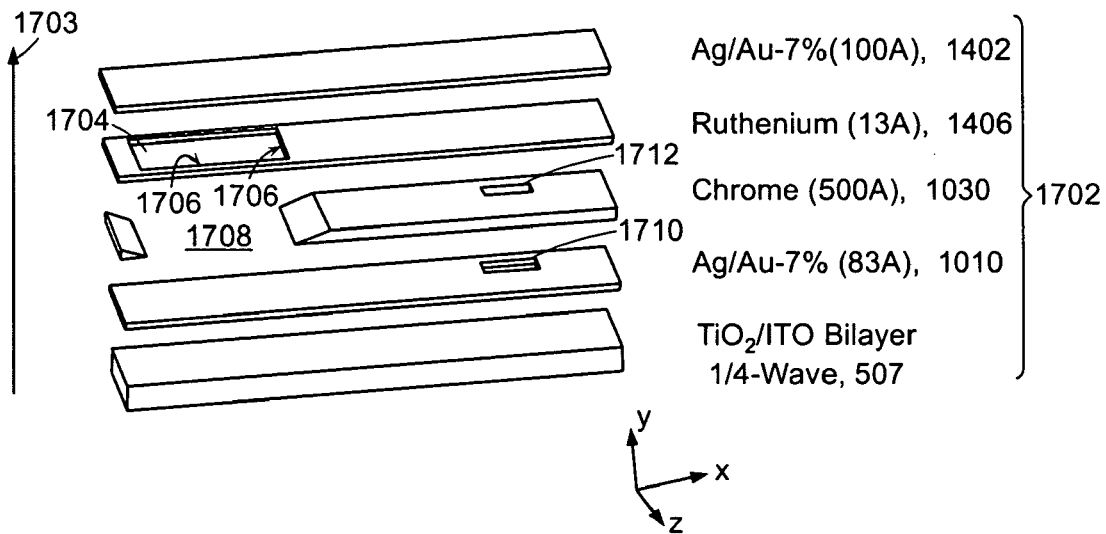
FIG. 17 is an exploded view of the coating stack used in the mirror assembly of FIG. 16.
Figure 18:
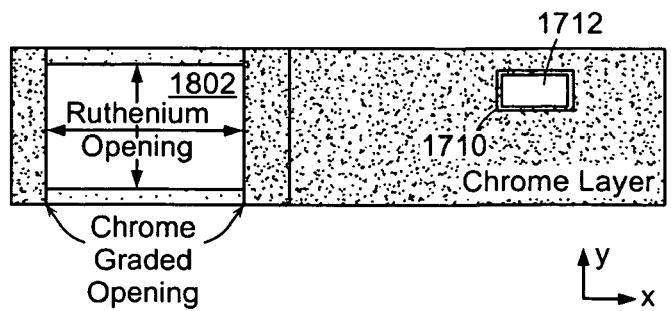
FIG. 18 is a top view of the coating stack shown in FIG. 17.
Figure 19A:
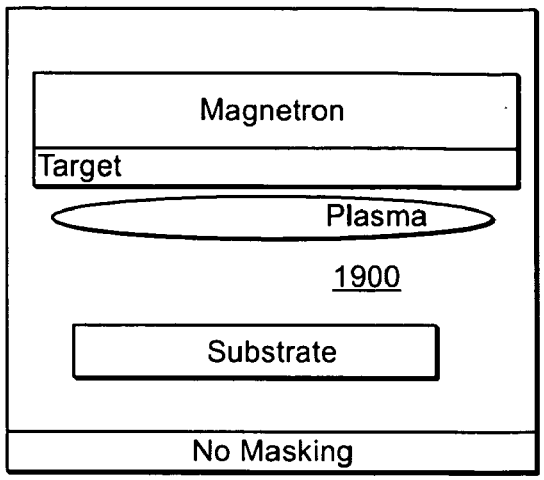
FIG. 19 shows examples of deposition configurations that may be used to fabricate thin-film stacks of embodiments of the present invention. (A): no masking involved; (B) solid mask in contact with an underlying substrate; (C) lifted solid mask; (D) lifted mesh or slit mask.
Figure 19B:
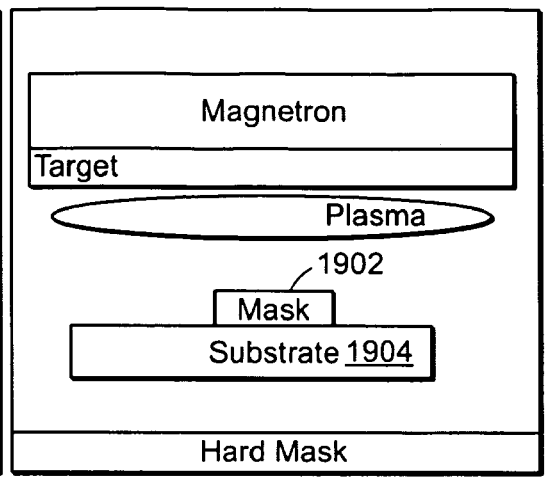
Figure 19C:
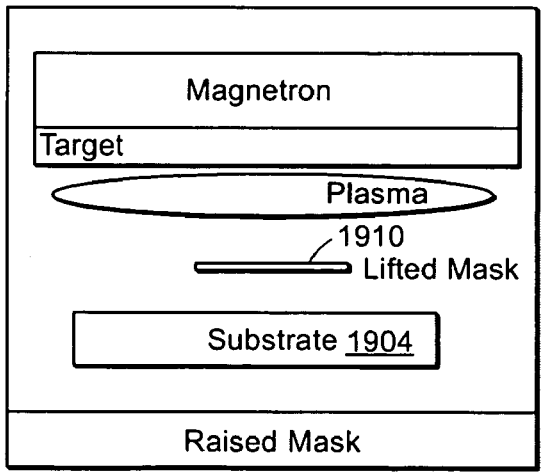
Figure 19D:
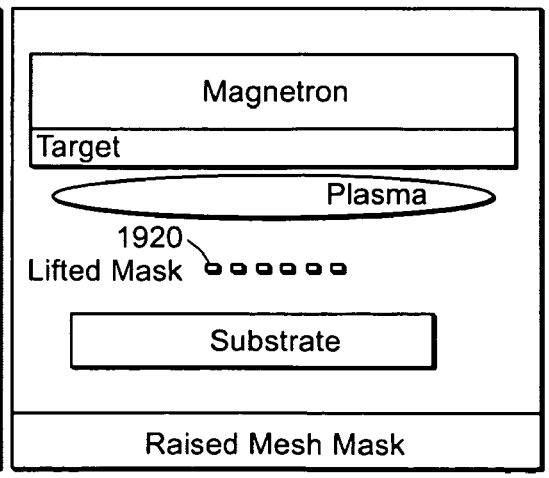

FIGS. 16, 17, and 18 illustrate yet another alternative embodiment of a multi-zone EC-mirror (such as the one used in an inside rearview mirror assembly). FIG. 16 schematically shows a front view of a layout for the mirror assembly that utilizes large and small displays. An EC-mirror of such assembly may employ the thin-film stack 1702 similar to the stack 1410 shown in FIG. 14. However, in comparison with FIG. 14, the thin-film stack 1702 of FIGS. 16, 17, and 18 defines two transflective areas 1602 and 1604. Otherwise, the material parameters of the stacks 1410 and 1702 are similar. The exploded and top views of one embodiment of the thin-film stack 1702 (deposited onto the third substrate of the mirror along the z-axis in the order indicated by an arrow 1703) are shown in FIGS. 17 and 18, respectively. In this embodiment, the layers of TiO2 and ITO, forming a base bi-layer 507 of FIG. 14, may be applied to the entire surface of the rear glass substrate 204. In the opaque area of the mirror (i.e., outside of the transflective areas 1602 and 1604, which respectively correspond to the large and small displays behind the EC mirror), the base bi-layer 507 can be further covered by the thin-film layers as discussed in Example 8.

In a large transflective area 1602 of FIG. 16, the two silver alloy layers 1010 and 1402 may be the only layers disposed on top of the base bi-layer 406, as shown in FIG. 17. To accommodate a large display behind the mirror, the Chromium opacifying layer 1030 may be appropriately masked across the second lite of glass so as to yield transitional gradients in the layer's thickness that are oriented along the x-axis and that extend substantially across the entire second light of glass along the y-axis, as shown in FIG. 17. As a result, the layer 1406 is interrupted at the large transflective area 1602. Moreover, as was disclosed in reference to FIG. 14, the graded Chromium layer 1030 may be terminated outside of the boundary of the large transflective display area 1602. The Ruthenium flash layer 1406, on the other hand, is shown to have a hard-edged aperture 1704 defined by edges 1706 that form corresponding "lips" 1408 of FIG. 14. As a result, the aperture 1802 in the Ruthenium opacifying layer 1406 is bigger than the opening 1708 in the Chromium opacifying layer 1030.

With respect to the small transflective area 1604, in one embodiment of the EC-mirror of FIG. 16 the transmittance and reflectance values of both the large and small transflective areas may be made substantially equal. In such embodiment, the two silver alloy reflecting layers 1010 and 1402 are preferably continuously extending over the substantially all of the small transflective area 1604. In an alternative embodiment, however, the small display area 1604 may have the lower silver alloy layer 1010 masked out to form an aperture 1710 as shown in FIG. 17. To complete the stack across the small transflective area 1604 in such alternative embodiment, the Chromium opacifying layer 1030 is disposed on top of the layer 1010 so as to align an aperture 1712 in the layer 1030 with the aperture 1710 in the layer 1010. The edges of the aperture 1712 may be graded to provide for a smooth transition of the optical characteristics in the transition region corresponding to the small transflective area 1604. A Ruthenium flash layer 1406 and the top reflecting silver alloy layer 1402, which is continuous across the small transflective area 1604, complete the formation of the small transflective area that has about 40.8 percent reflectance and about 39.9 percent transmittance. It shall be realized, that auxiliary layers that may be used additionally to those described in reference to FIGS. 16 through 18 to provide, in alternative specific embodiments, localized opacification in a graded transition region, may also have a graded edge, a hard edge, or a combination of both. The choice of edge properties may be generally based on the design goals of a given application.

Figure 20:
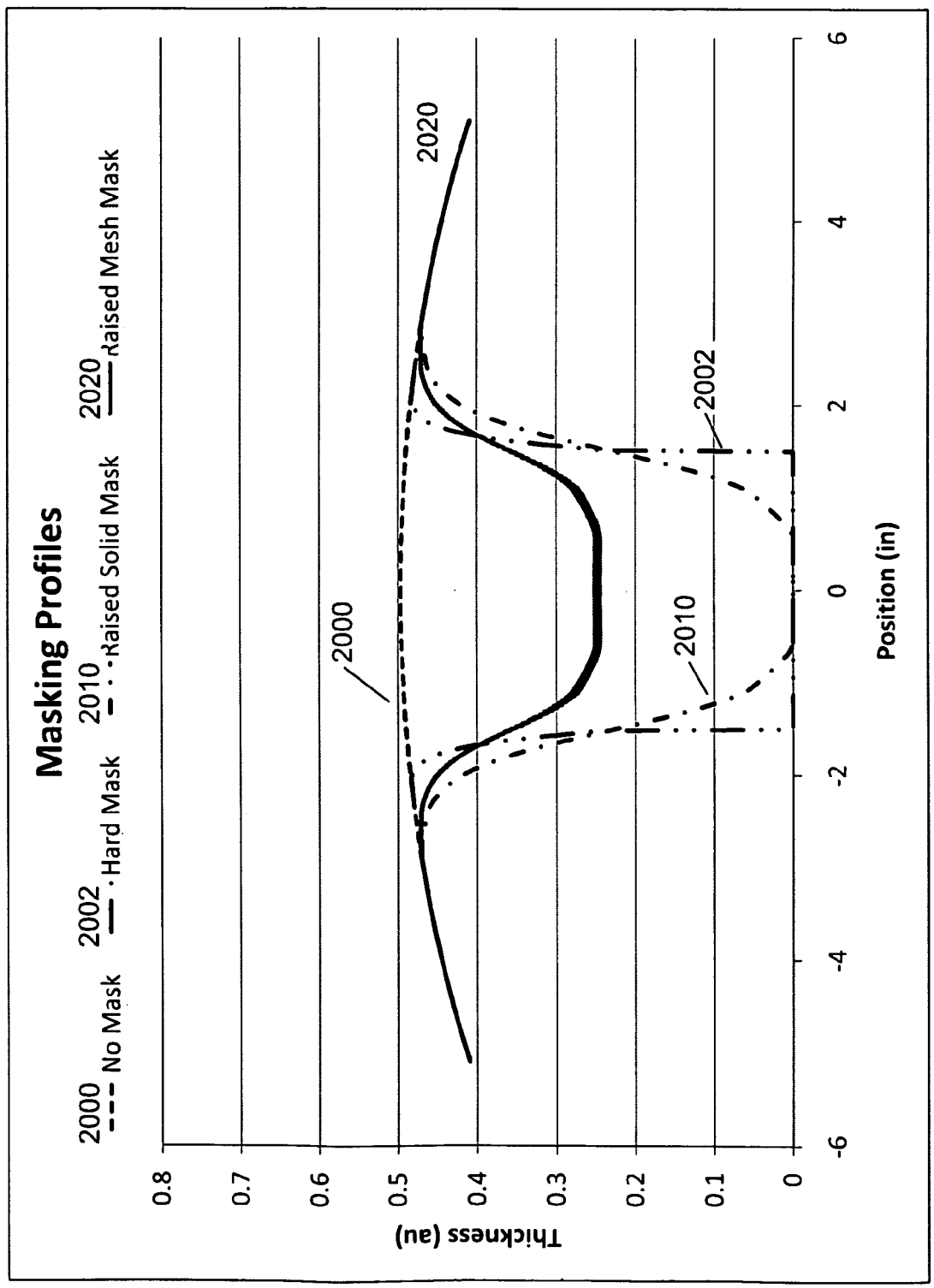
FIG. 20 shows profiles of thin-film layers deposited with the use of respective configurations of FIG. 19.

Various methods can be utilized to generate profiles of thin-film layers that are discussed in reference to embodiments of the present invention. For example, when using magnetron sputtering of thin-film layers, the shape and size of the deposition device such as a magnetron sputtering cathode can be used to tailor the thickness profile of the layer being deposited. In addition, the profile of magnetic field distribution in a magnetron can be adjusted to modify the deposition profile. Alternatively, moving the deposition device relative the substrate may also result in shaping the deposition profile. Masking a substrate is a commonly utilized method of controlling deposition. Often, a goal of masking is to produce a hard-masked edge between a layer having predetermined thickness and an area of the substrate having no deposited material. This goal is generally accomplished by placing a mask in direct contact with the substrate, but is sometimes accompanied with "rolls over" of the deposited layer onto the exposed portion of the substrate due to shadowing by the mask. Another approach to masking is to use a mask that is "raised up" off the surface of the substrate by some non-zero distance to place the mask in the region between the deposition source and the substrate surface. For several types of PVD sources, the flux of material is approximately reciprocal to the second degree of the distance between each contributing surface segment of the target and each exposed surface segment of the substrate and proportional to the second degree of cosine of the angle between the direction of deposition and the normal to the target surface for each segment combination. In the case of a raised mask thin-film deposition, these dependencies may be employed to yield an approximate quintic profile of the deposited layer. The relative slope of the approximate quintic profile is modified by the height of the raised mask above the substrate surface. If it is preferable to gradually change a coating thickness from one value to another non-zero value, a raised mask with a plurality of openings, such as a mask containing a plurality of slits or mesh mask, can be utilized. The ratio of open area to closed area in such a mask determines the ratio of thickness of layer under the mask relative to that in non-masked regions. FIG. 19 schematically illustrates various masking approaches, including no masking 1900, hard mask 1902 on a substrate 1904, solid mask 1910 lifted (or raised) above the substrate 1904, and lifted mesh mask 1920. FIG. 20 demonstrates types of deposition profiles that can be obtained from the styles of masking shown in FIG. 19. These particular examples are not limiting and are shown to demonstrate the flexibility of the masking approach to controlling thickness uniformity. The examples shown herein often refer to layers of essentially equivalent thickness. It should be understood that there may be variations in thickness across the part due to non-uniformity of the thin film deposition inherent in some deposition system. The variations in layer thickness originating with such deposition methods are within the scope of the present invention.

Figure 21:
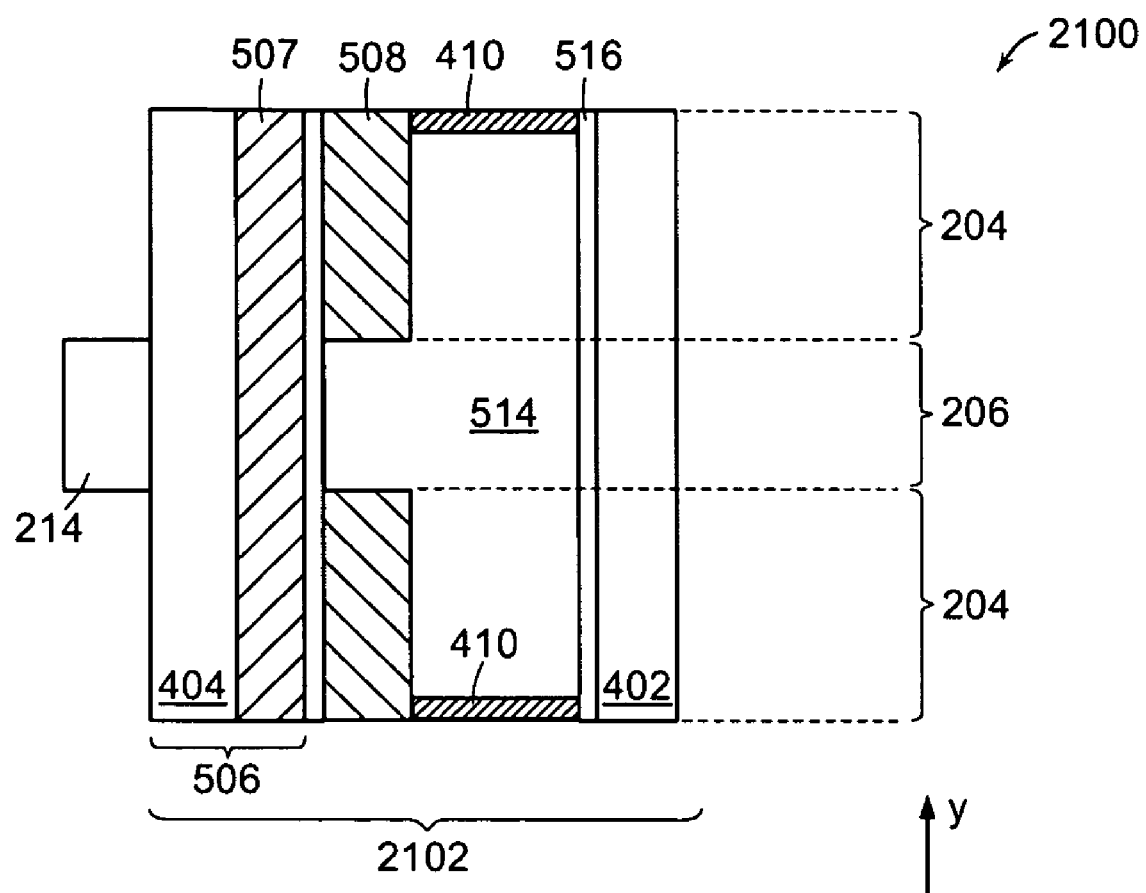
FIG. 21 shows an alternative embodiment of an electrochromic mirror incorporating an embodiment of a mirror element according to the present invention.

The embodiments of the invention described above are intended to be merely exemplary; numerous variations and modifications will be apparent to those skilled in the art. All such variations and modifications are intended to be within the scope of the present invention as defined in any appended claims. For example, in a specific embodiment utilizing an abrupt transition between the opaque and transflective areas of the mirror element, it is possible to use an opacifying layer as a reflective layer reducing the number of layers in total. An embodiment 2100 of this simplified design is shown in FIG. 21. As shown in FIG. 19, and in comparison with FIG. 7(A), the upper reflecting layer 712 is removed and a 30 nm thick Ruthenium opacifying layer 508 is exposed to the ECM 514. The thickness of the silver alloy layer 510 is appropriately adjusted to 19.8 nm to match the reflectance values between the opaque and transflective areas, 204 and 206. As shown in this embodiment, the display 214 in the rear of the EC-mirror 2102 is disposed at a distance from the fourth surface of the EC-mirror, which does not affect the scope of the invention. Moreover, the layer 508 can be made from other metals as disclosed, e.g., in U.S. Pat. No. 6,700,692, to appropriately adjust the reflectance value and/or color in the opaque area or alter the physical properties of the thin-film stack on surface III. In further reference to FIG. 9, for example, by appropriately grading thin-film layers 802 and 904 at different rate, the transflective area of the mirror can be provided with higher reflectance than that of the opaque area.

Although specific embodiments of the invention were disclosed with examples of only several materials used in their fabrication, in alternative embodiments different materials may be used without deviating from the scope of the invention. For example, reflective layers (also performing as electrodes providing electrical communication with the ECM) can be fabricated from various silver alloys such as AgPd, AgAu, AgPt, AgRh, AgTi, AuNi, Ag. Alternatively, the electrodes may be fabricated from Si with oxide overcoat, such as Si/SiO2/F:SnO2, or Ni, Cr, Rh, Pd, Au, Ru, Stainless Steel (SS), Pt, Iridium or combinations or alloys thereof. Generally, the reflective thin-films stacks on fourth or third surfaces of the EC-mirror that utilizes a mirror element according to the present invention may include a "high index-low index-high-index (HLH)" dielectric stacks capped with a layer of conductive material. Additional low index/high index pairs may be added to the stack to further increase the reflectance and aid in color tuning. A high index material may be chosen from, e.g., ITO, F:SnO2, TiO2, SnO2, TaO5, ZnOx, ZrOx, FeOx, Si or other high index materials. A low-index layer can be made of SiO2, NbOx, MgF, AlOx, or other low-index materials, and a conductive layer may include a layer of material such as one of Ag-alloys or a TCO such as ITO. It should be noted that the use, for such purpose, of materials such as Ag/Cu, Cu may compromise the ability of the particular embodiment to provide for color neutrality between the opaque and transflective areas of the mirror element, while the use of Cr, SS, Rh, Pt, Pd, Inconel, Ti, Mo compromises the uniformity of reflectance across the surface of the mirror element. The use of Cr, SS, or Mo, on the other hand, may affect electrical stability of the thin-film coatings.

Reflective layers of the thin-film stack may be additionally overcoated with about 300 A or less of Mo, Rh, Ru, Pd, Pt, Ni, W and the alloys of these materials. Alternatively, the reflector overcoat may include a layer of transparent conductor such as transparent metal oxide (e.g. $TiO_2$, $SiO_2$) or metal sulfide (e.g., ZnS) providing such layer is either thin enough or structured to sufficiently conduct electricity.

Base layers (such as the layer 507 described above) can be generally fabricated from oxides or nitrides of metals such as Cr, SS, Si, Ti, Ni, Mo, CrOx, ZnO, or alloys of Cr/Mo/Ni, Cr/Ni, Mo, Ni-based alloys (such as Inconel), Ta, Al, Cd, Cr, Co, Cu, Au, IR, Fe, Mg, Mo, Ni, Os, Pd, Pt, Rh, Ru, Ag, Sn, W, Zn, and various alloys and mixtures.

Generally, the embodiments of a reflector or a mirror element (referred to hereinafter as reflective elements) of the invention may be configured to define a convex element, an aspheric element, a planar element, a non-planar element, an element having a wide field-of-view, or a combination of these various configurations in different areas to define a mirror element with generally complex shape. In case of an electrochromic mirror assembly, the first surface of the first substrate may comprise a hydrophilic or hydrophobic coating to improve the operation. The embodiments of the reflective elements may comprise an anti-scratch layer on the exposed surfaces of at least one of the first and second substrates. Examples of various reflective elements are described in U.S. Pat. Nos. 5,682,267, 5,689,370, 5,825,527, 5,940,201, 5,998, 617, 6,020,987, 6,037,471, 6,057,956, 6,062,920, 6,064,509, 6,111,684, 6,166,848, 6,193,378, 6,195,194, 6,239,898, 6,246,507, 6,268,950, 6,356,376, 6,441,943, and 6,512,624. The disclosure of each of these patents is incorporated herein in its entirety by reference.

With respect to electrochromic mirror assemblies utilizing embodiments of mirror elements of the present invention, such assemblies contain an electrochromic medium. Electrochromic medium is preferably capable of selectively attenuating light traveling therethrough and preferably has at least one solution-phase electrochromic material and preferably at least one additional electroactive material that may be solution-phase, surface-confined, or one that plates out onto a surface. However, the presently preferred media are solution-phase redox electrochromics, such as those disclosed in commonly assigned U.S. Pat. Nos. 4,902,108, 5,128,799, 5,278, 693, 5,280,380, 5,282,077, 5,294,376, 5,336,448, 5,808,778 and 6,020,987. The entire disclosure of each of these patents is incorporated herein in by reference. If a solution-phase electrochromic medium is utilized, it may be inserted into the chamber through a sealable fill port through well-known techniques, such as vacuum backfilling and the like. In addition, the disclosure of each of U.S. Pat. Nos. 6,594,066, 6,407,847, 6,362,914, 6,353,493, 6,310,714 is incorporated herein by reference in its entirety.

Electrochromic medium preferably includes electrochromic anodic and cathodic materials that can be grouped into the following categories:

(i) Single layer: The electrochromic medium is a single layer of material that may include small inhomogeneous regions and includes solution-phase devices where a material is contained in solution in the ionically conducting electrolyte and remains in solution in the electrolyte when electrochemically oxidized or reduced. U.S. Pat. No. 6,193,912 entitled "NEAR INFRARED-ABSORBING ELECTROCHROMIC COMPOUNDS AND DEVICES COMPRISING SAME"; U.S. Pat. No. 6,188,505 entitled "COLOR STABILIZED ELECTROCHROMIC DEVICES"; U.S. Pat. No. 6,262,832 entitled "ANODIC ELECTROCHROMIC MATERIAL HAVING A SOLUBLIZING MOIETY"; U.S. Pat. No. 6,137,620 entitled "ELECTROCHROMIC MEDIA WITH CONCENTRATION ENHANCED STABILITY PROCESS FOR PREPARATION THEREOF AND USE IN ELECTROCHROMIC DEVICE"; U.S. Pat. No. 6,195,192 entitled "ELECTROCHROMIC MATERIALS WITH ENHANCED ULTRAVIOLET STABILITY"; U.S. Pat. No. 6,392,783 entitled "SUBSTITUTED METALLOCENES FOR USE AS AN ANODIC ELECTROCHROMIC MATERIAL AND ELECTROCHROMIC MEDIA AND DEVICES COMPRISING SAME"; and U.S. Pat. No. 6,249,369 entitled "COUPLED ELECTROCHROMIC COMPOUNDS WITH PHOTOSTABLE DICTATION OXIDATION STATES" disclose anodic and cathodic materials that may be used in a single layer electrochromic medium, the entire disclosures of which are incorporated herein by reference. Solution-phase electroactive materials may be contained in the continuous solution phase of a cross-linked polymer matrix in accordance with the teachings of U.S. Pat. No. 5,928,572, entitled "IMPROVED ELECTROCHROMIC LAYER AND DEVICES COMPRISING SAME" or International Patent Application No. PCT/US98/05570 entitled "ELECTROCHROMIC POLYMERIC SOLID FILMS, MANUFACTURING ELECTROCHROMIC DEVICES USING SUCH SOLID FILMS, AND PROCESSES FOR MAKING SUCH SOLID FILMS AND DEVICES," the entire disclosures of which are incorporated herein by reference.

At least three electroactive materials, at least two of which are electrochromic, can be combined to give a pre-selected color as described in U.S. Pat. No. 6,020,987 entitled "ELECTROCHROMIC MEDIUM CAPABLE OF PRODUCING A PRE-SELECTED COLOR," the entire disclosure of which is incorporated herein by reference. This ability to select the color of the electrochromic medium is particularly advantageous when designing information displays with associated elements.

The anodic and cathodic materials can be combined or linked by a bridging unit as described in International Application No. PCT/WO97/EP498 entitled "ELECTROCHROMIC SYSTEM," the entire disclosure of which is incorporated herein by reference. It is also possible to link anodic materials or cathodic materials by similar methods. The concepts described in these applications can further be combined to yield a variety of electrochromic materials that are linked.

Additionally, a single layer medium includes the medium where the anodic and cathodic materials can be incorporated into the polymer matrix as described in International Application No. PCT/WO98/EP3862 entitled "ELECTROCHROMIC POLYMER SYSTEM," U.S. Pat. No. 6,002,511, or International Patent Application No. PCT/US98/05570 entitled "ELECTROCHROMIC POLYMERIC SOLID FILMS, MANUFACTURING ELECTROCHROMIC DEVICES USING SUCH SOLID FILMS, AND PROCESSES FOR MAKING SUCH SOLID FILMS AND DEVICES," the entire disclosures of which are incorporated herein by reference.

Also included is a medium where one or more materials in the medium undergoes a change in phase during the operation of the device, for example, a deposition system where a material contained in solution in the ionically conducting electrolyte which forms a layer, or partial layer on the electronically conducting electrode when electrochemically oxidized or reduced.

(ii) Multilayer: The medium is made up in layers and includes at least one material attached directly to an electronically conducting electrode or confined in close proximity thereto which remains attached or confined when electrochemically oxidized or reduced. Examples of this type of electrochromic medium are the metal oxide films, such as tungsten oxide, iridium oxide, nickel oxide, and vanadium oxide. A medium, which contains one or more organic electrochromic layers, such as polythiophene, polyaniline, or polypyrrole attached to the electrode, would also be considered a multilayer medium.

In addition, the electrochromic medium may also contain other materials, such as light absorbers, light stabilizers, thermal stabilizers, antioxidants, thickeners, or viscosity modifiers.

It may be desirable to incorporate a gel into the electrochromic device as disclosed in commonly assigned U.S. Pat. No. 5,940,201 entitled "AN ELECTROCHROMIC MIR- ROR WITH TWO THIN GLASS ELEMENTS AND A GELLED ELECTROCHROMIC MEDIUM". The entire disclosure of this U.S. patent is incorporated herein by reference.

In at least one embodiment of a rearview mirror assembly utilizing a mirror element according to the present invention, the rearview mirror assembly is provided with an electro-optic element having a substantially transparent seal. Examples of EC-structures, substantially transparent seals and methods of forming substantially transparent seals are provided in U.S. Pat. No. 5,790,298, the entire disclosure of which is included herein by reference. U.S. Pat. Nos. 6,665,107, 6,714,334, 6,963,439, 6,195,193, 6,157,480, 7,190,505, 7,414,770, and U.S. patent application Ser. No. 12/215,712 disclose additional subject matter related to seals and seal materials. The disclosure of each of theses documents is incorporated herein by reference in its entirety.

In at least one embodiment, a mirror element according to the invention or a mirror assembly utilizing such mirror element may include a spectral filter material and/or a bezel for protecting the associated seal from damaging light rays and to provide an aesthetically pleasing appearance. Examples of various bezels are disclosed, e.g., in U.S. Pat. Nos. 5,448,397, 6,102,546, 6,195,194, 5,923,457, 6,238,898, 6,170,956 and 6,471,362, the disclosure of each of which is incorporated herein in its entirety by reference.

As discussed above, in at least one embodiment, a mirror element can be used in conjunction with a display such as an RCD or another light source. Discussion of various displays that can be used with embodiments of the invention is provided, e.g., in U.S. Provisional Application No. 60/780,655 filed on Mar. 9, 2006; U.S. Provisional Application No. 60/804,351 filed on Jun. 9, 2006; U.S. Patent Application Publication Nos. 2008/0068520 and 2006/0007550; and U.S. patent application Ser. Nos. 11/179,798 12/193,426 filed on Aug. 18, 2008. The entire disclosures of each of these applications are incorporated herein by reference. Generally, a light source can be disposed as a stand-alone component behind the mirror element (as shown, for example, in FIGS. 1-4) or be in physical contact with the mirror element (as shown, for example, in FIGS. 5-10).

In at least one of embodiments, a mirror element of the invention may be incorporated in a mirror assembly that may include a glare light sensor and an ambient light sensor, which are described in commonly assigned U.S. Pat. Nos. 6,359,274 and 6,402,328. The disclosure of each of these patents is incorporated herein by reference in its entirety. The electrical output signal from either or both of these sensors may be used as inputs to a controller on a circuit board of the assembly that controls the intensity of display backlighting. The details of various control circuits for use herewith are described in commonly assigned U.S. Pat. Nos. 5,956,012; 6,084,700; 6,222,177; 6,224,716; 6,247,819; 6,249,369; 6,392,783; and 6,402,328, the disclosures of which are incorporated in their entireties herein by reference. These systems may be integrated, at least in part, in a common control with information displays and/or may share components with the information displays. In addition, the status of these systems and/or the devices controlled thereby may be displayed on the associated information displays.

Figure 22:
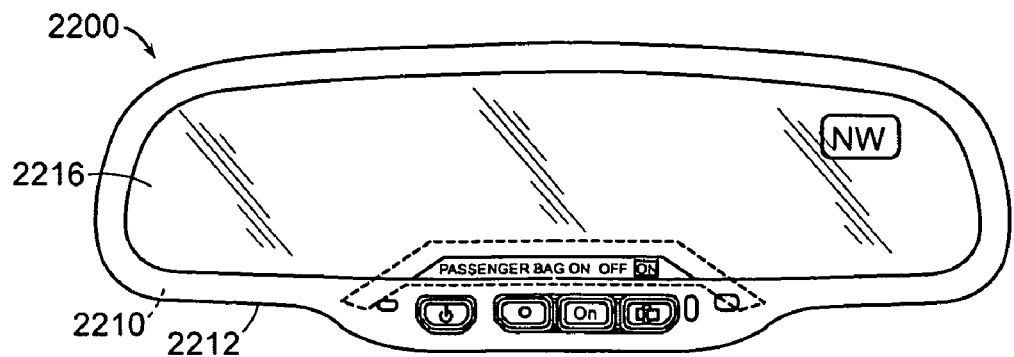
FIG. 22 shows, in front view, an electrochromic mirror assembly incorporating an embodiment of the present invention.
Figure 23:
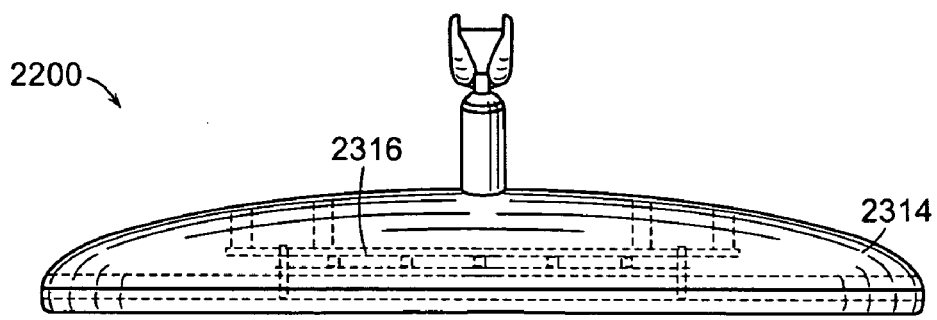
FIG. 23 shows a side view of the mirror assembly of FIG. 22.
Figure 24:
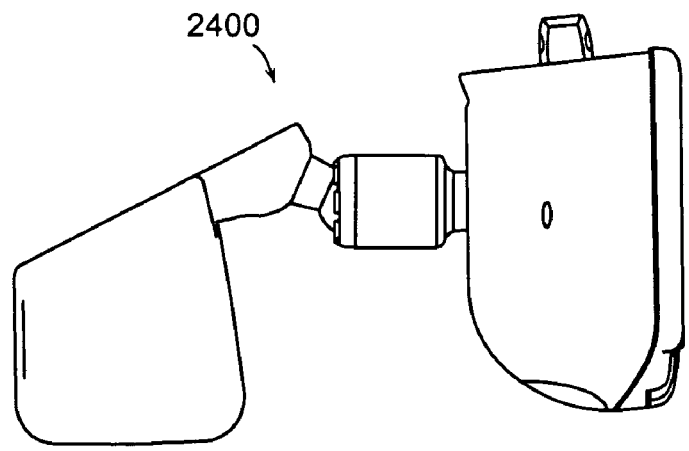
FIG. 24 shows an alternative embodiment of an electrochromic mirror assembly incorporating an embodiment of a mirror element of the present invention.

As mentioned above, mirror assemblies incorporating embodiments of the invention may generally include an EC-mirror, light sources such as a display behind, and various auxiliary components. As schematically shown in FIGS. 22 and 23, a mirror assembly 2200 includes a housing 2210 and a bezel 2212 defining a cavity 2314, and further includes an electrochromic mirror subassembly 2216 supported in the cavity 2314 along with a printed circuit board 2316. The printed circuit board 2316 has a circuit thereon that is configured to operate the electrochromic mirror subassembly 2220 for controlled darkening to reduce glare in the mirror assembly 2200. FIG. 24 shows, in side view, another embodiment of a mirror assembly 2400 incorporating the mirror element of the invention and a display. Other examples of mirror assemblies that may include embodiments of the present invention are disclosed, e.g., in commonly-assigned patent application Ser. Nos. 11/684,336; 12/193,426; 12/189,853; and 12/196,476, the disclosure of each of which is incorporated herein by reference in its entirety.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A multi-zone reflector comprising:
   a substantially transparent supporting base;
   a lower reflecting layer disposed adjacent the supporting base, the lower reflecting layer substantially completely covering a first transflective zone of the reflector;
   an opacifying layer having a lower surface facing the supporting base and an upper surface, the opacifying layer disposed substantially outside the first transflective zone adjacent to the lower reflecting layer of the reflector; and
   an upper reflecting layer extending substantially completely over the opacifying layer and the first transflective zone of the reflector, the upper reflecting layer and the lower reflecting layer having a common surface over at least a portion of the first transflective zone,
   wherein the supporting base includes a base layer deposited on a substantially transparent substrate.

2. A reflector according to claim 1, wherein a portion of the upper surface of the opacifying layer is inclined with respect to the lower surface of the opacifying layer.

3. A reflector according to claim 1, wherein the inclined portion of the upper surface of the opacifying layer bridges the opaque and first transflective zones of the reflector.

4. A reflector according to claim 1, wherein the multi-zone reflector has at least one optical characteristic that is substantially unvarying across the reflector.

5. A reflector according to claim 4, wherein the at least one optical characteristic includes a reflectance spectrum.

6. A reflector according to claim 1, wherein the opacifying layer has an aperture at the first transflective zone of the reflector.

7. A reflector according to claim 1, wherein the upper reflecting layer extends substantially completely over a second transflective zone of the reflector, the second transflective zone being disjoined from the first transflective zone.

8. A reflector according to claim 1, wherein the upper reflecting layer has substantially uniform thickness.

9. A reflector according to claim 1, further comprising
   a flash layer of material interposed at the opaque zone between the upper continuous reflecting layer and the upper surface of the opacifying layer, the flash layer substantially completely covering the opacifying layer.

10. A reflector according to claim 9, wherein the flash layer has thickness increasing in a direction from the transflective zone to the opaque zone.

11. An electrochromic mirror comprising a reflector according to claim 9.

12. A reflector according to claim 9, wherein the reflector has a substantially uniform reflectance exceeding at least 50 percent across the reflector.

13. A reflector according to claim 12, wherein the opaque zone has transmittance below 0.5 percent and the transflective zone has transmittance level below 25 percent.

14. A reflector according to claim 1, wherein the base layer includes a thin-film stack having a quarter-wave optical thickness.

15. A reflector according to claim 1, wherein the upper and lower reflecting layers have a common surface over at least a portion of the transflective zone of the reflector.

16. An electrochromic mirror comprising a reflector according to claim 1.

17. A multi-zone reflector comprising:
a supporting base;
an opacifying layer disposed on the supporting base substantially outside a transflective zone of the reflector, the opacifying layer having a lower surface facing the supporting base and an upper surface, the opacifying layer having thickness increasing with displacement in a first direction from the transflective zone to an opaque zone of the reflector, the thickness of the opacifying layer increasing at a first rate; and
an upper continuous reflecting layer substantially completely covering the upper surface of the opacifying layer and the transflective zone, the upper continuous reflecting layer having thickness decreasing with displacement in a second direction from the transflective zone to the opaque zone of the reflector, the thickness of the upper continuous reflecting layer decreasing at a second rate.

18. A reflector according to claim 17, further comprising a lower continuous reflecting layer interposed between the supporting base and the lower surface of the opacifying layer.

19. A reflector according to claim 17, wherein the first and second rates are different.

20. A reflector according to claim 17, wherein a region of decreasing thickness of the upper continuous reflecting layer bridges the opaque and transflective zones of the reflector.

21. A reflector according to claim 17, wherein spectral content of light reflected from the opaque zone and that of light reflected from the transflective zone differ by no more that 5 units of ΔE* per centimeter.

22. A reflector according to claim 21, wherein spectral content of light reflected from the opaque zone and that of light reflected from the transflective zone differ by no more that 2.5 units of ΔE* per centimeter.

23. A reflector according to claim 21, wherein spectral content of light reflected from the opaque zone and that of light reflected from the transflective zone differ by no more that 1 unit of ΔE* per centimeter.

24. A reflector according to claim 17, further comprising a quarter-wave thin-film stack interposed between the opacifying layer and the supporting base, said quarter-wave thin-film stack substantially completely covering the supporting base, and wherein the second rate is zero.

25. A multi-zone reflector comprising:
a substantially transparent supporting base;
a lower reflective layer substantially continuously covering a transflective zone of the supporting base; and
a thin-film stack disposed on the lower reflective layer, the thin-film stack including
a first opacifying layer having a lateral bound and deposited adjacent the lower reflective layer so as to define a first zone of the stack that is free of the first opacifying layer, the first opacifying layer having thickness decreasing in a direction towards the first zone; and
a second opacifying layer deposited adjacent the first layer so as to extend over the first opacifying layer and beyond the lateral bound of the first opacifying layer, the second opacifying layer defining a second zone of the stack that is free of the second opacifying layer, the second zone characterized by a lateral extent that is smaller than a lateral extent of the first zone, the second zone being partially aligned with the first zone along a direction perpendicular to the stack.

26. A reflector according to claim 25, further comprising: an upper reflective layer deposited on the second opacifying layer, the upper reflective layer being substantially spatially coextensive with the lower reflective layer.

27. A reflector according to claim 25, wherein the second opacifying layer has uniform thickness.

28. A reflector according to claim 25, wherein the second zone is defined by a hard-edge in the second opacifying layer.

29. A multi-zone reflector comprising:
a substantially transparent supporting base;
a lower reflective layer substantially continuously covering the supporting base; and
a thin-film stack deposited on the supporting base, the thin film stack including
a first opacifying layer deposited adjacent the lower reflective layer and a second opacifying layer deposited adjacent the first opacifying layer, the first opacifying layer characterized by a first opening therein, the second opacifying layer characterized by a second opening therein, the first opacifying layer having a graded portion characterized by thickness increasing in a direction away from the first opening, the second opacifying layer extending over at least part of the first opening.

30. A reflector according to claim 29, wherein the graded portion of the first opacifying layer defines a transition region of the multi-zone reflector, the transition region having spatially monotonic distribution of at least one optical characteristic.

31. A reflector according to claim 30, wherein the at least one optical characteristic includes a reflectance spectrum.

* * * * *